US009644993B2

(12) United States Patent
Adest et al.

(10) Patent No.: US 9,644,993 B2
(45) Date of Patent: May 9, 2017

(54) MONITORING OF DISTRIBUTED POWER HARVESTING SYSTEMS USING DC POWER SOURCES

(71) Applicant: Solaredge Technologies Ltd., Hod Hasharon (IL)

(72) Inventors: Meir Adest, Raanana (IL); Lior Handelsman, Givataim (IL); Yoav Galin, Raanana (IL); Amir Fishelov, Tel Aviv (IL); Guy Sella, Bitan Aharon (IL)

(73) Assignee: Solaredge Technologies Ltd., Herzeliya (IL)

( * ) Notice: Subject to any disclaimer, the term of this patent is extended or adjusted under 35 U.S.C. 154(b) by 157 days.

(21) Appl. No.: 14/513,877

(22) Filed: Oct. 14, 2014

(65) Prior Publication Data

US 2015/0100257 A1    Apr. 9, 2015

Related U.S. Application Data

(63) Continuation of application No. 13/901,890, filed on May 24, 2013, now Pat. No. 8,903,681, which is a
(Continued)

(51) Int. Cl.
*G01D 4/00* (2006.01)
*H02J 3/38* (2006.01)
(Continued)

(52) U.S. Cl.
CPC .......... *G01D 4/004* (2013.01); *G01R 22/063* (2013.01); *H02J 3/385* (2013.01); *H02J 3/383* (2013.01);
(Continued)

(58) Field of Classification Search
CPC ...................................................... G01D 4/004
See application file for complete search history.

(56) References Cited

U.S. PATENT DOCUMENTS 2,367,925 A    1/1945    Brown
2,758,219 A    8/1956    Miller
(Continued)

FOREIGN PATENT DOCUMENTS

AU    2073800 A    9/2000
AU    2005262278 A1    1/2006
(Continued)

OTHER PUBLICATIONS

Ciobotaru, et al., Control of single-stage single-phase PV inverter, Aug. 7, 2006.
(Continued)

*Primary Examiner* — Manuel Rivera Vargas
(74) *Attorney, Agent, or Firm* — Banner & Witcoff, Ltd.

(57) ABSTRACT

A monitoring system and method for monitoring performance of individual powers sources in a distributed power source system. A monitoring module is coupled to each of the power sources, or to each string of serially connected power sources, to monitor and collect data regarding current, voltage, temperature and other environmental factors at the power source. The collected data is transmitted over a power line to a central analysis station for analysis. Data collected from each source indicates malfunction or degradation at the source. Comparison of data collected from adjacent sources filters for environmental factors impacting neighboring sources such as cloudy days for a solar panel. Comparison of data collected from the same source at different times indicates soiling or degradation of the source with time or periodic events such as a moving shade from an adjacent building.

18 Claims, 9 Drawing Sheets

Related U.S. Application Data continuation of application No. 11/951,419, filed on Dec. 6, 2007, now Pat. No. 8,473,250.

(60) Provisional application No. 60/916,815, filed on May 9, 2007, provisional application No. 60/908,095, filed on Mar. 26, 2007, provisional application No. 60/868,962, filed on Dec. 7, 2006, provisional application No. 60/868,893, filed on Dec. 6, 2006, provisional application No. 60/868,851, filed on Dec. 6, 2006.

(51) Int. Cl.
  *G01R 22/06* (2006.01)
  *H02J 13/00* (2006.01)

(52) U.S. Cl.
  CPC ....... *H02J 13/0024* (2013.01); *H02J 13/0062* (2013.01); *H02J 13/0075* (2013.01); *Y02B 10/14* (2013.01); *Y02B 70/3208* (2013.01); *Y02B 70/343* (2013.01); *Y02B 70/346* (2013.01); *Y02B 90/242* (2013.01); *Y02B 90/245* (2013.01); *Y02B 90/248* (2013.01); *Y02B 90/2623* (2013.01); *Y02B 90/2638* (2013.01); *Y02B 90/2653* (2013.01); *Y02E 10/563* (2013.01); *Y02E 10/58* (2013.01); *Y02E 40/72* (2013.01); *Y02E 60/74* (2013.01); *Y04S 10/123* (2013.01); *Y04S 10/30* (2013.01); *Y04S 20/322* (2013.01); *Y04S 20/34* (2013.01); *Y04S 20/40* (2013.01); *Y04S 20/52* (2013.01); *Y04S 20/525* (2013.01); *Y04S 40/122* (2013.01); *Y04S 40/124* (2013.01); *Y04S 40/126* (2013.01); *Y10T 307/571* (2015.04); *Y10T 307/685* (2015.04); *Y10T 307/707* (2015.04)

(56) References Cited

U.S. PATENT DOCUMENTS

| | | |
|---|---|---|
| 2,852,721 A | 9/1958 | Harders et al. |
| 3,369,210 A | 2/1968 | Manickella |
| 3,392,326 A | 7/1968 | Lamberton |
| 3,566,143 A | 2/1971 | Paine et al. |
| 3,596,229 A | 7/1971 | Hohorst |
| 3,696,286 A | 10/1972 | Ule |
| 3,958,136 A | 5/1976 | Schroeder |
| 4,060,757 A | 11/1977 | McMurray |
| 4,101,816 A | 7/1978 | Shepter |
| 4,104,687 A | 8/1978 | Zulaski |
| 4,129,788 A | 12/1978 | Chavannes |
| 4,146,785 A | 3/1979 | Neale |
| 4,161,771 A | 7/1979 | Bates |
| 4,171,861 A | 10/1979 | Hohorst |
| 4,183,079 A | 1/1980 | Wachi |
| 4,257,087 A | 3/1981 | Cuk |
| 4,296,461 A | 10/1981 | Mallory et al. |
| 4,321,581 A | 3/1982 | Tappeiner et al. |
| 4,346,341 A | 8/1982 | Blackburn et al. |
| 4,367,557 A | 1/1983 | Stern et al. |
| 4,375,662 A | 3/1983 | Baker |
| 4,404,472 A | 9/1983 | Steigerwald |
| 4,412,142 A | 10/1983 | Ragonese et al. |
| 4,452,867 A | 6/1984 | Conforti |
| 4,453,207 A | 6/1984 | Paul |
| 4,460,232 A | 7/1984 | Sotolongo |
| 4,479,175 A | 10/1984 | Gille et al. |
| 4,481,654 A | 11/1984 | Daniels et al. |
| 4,488,136 A | 12/1984 | Hansen et al. |
| 4,545,997 A | 10/1985 | Wong et al. |
| 4,549,254 A | 10/1985 | Kissel |
| 4,554,502 A | 11/1985 | Rohatyn |
| 4,554,515 A | 11/1985 | Burson et al. |
| 4,580,090 A | 4/1986 | Bailey et al. |
| 4,591,965 A | 5/1986 | Dickerson |
| 4,598,330 A | 7/1986 | Woodworth |
| 4,602,322 A | 7/1986 | Merrick |
| 4,604,567 A | 8/1986 | Chetty |
| 4,623,753 A | 11/1986 | Feldman et al. |
| 4,626,983 A | 12/1986 | Harada et al. |
| 4,631,565 A | 12/1986 | Tihanyi |
| 4,637,677 A | 1/1987 | Barkus |
| 4,639,844 A | 1/1987 | Gallios et al. |
| 4,641,042 A | 2/1987 | Miyazawa |
| 4,641,079 A | 2/1987 | Kato et al. |
| 4,644,458 A | 2/1987 | Harafuji et al. |
| 4,649,334 A | 3/1987 | Nakajima |
| 4,652,770 A | 3/1987 | Kumano |
| 4,683,529 A | 7/1987 | Bucher, II |
| 4,685,040 A | 8/1987 | Steigerwald et al. |
| 4,686,617 A | 8/1987 | Colton |
| 4,706,181 A | 11/1987 | Mercer |
| 4,719,553 A | 1/1988 | Hinckley |
| 4,720,667 A | 1/1988 | Lee et al. |
| 4,720,668 A | 1/1988 | Lee et al. |
| 4,736,151 A | 4/1988 | Dishner |
| 4,772,994 A | 9/1988 | Harada et al. |
| 4,783,728 A | 11/1988 | Hoffman |
| 4,819,121 A | 4/1989 | Saito et al. |
| RE33,057 E | 9/1989 | Clegg et al. |
| 4,864,213 A | 9/1989 | Kido |
| 4,868,379 A | 9/1989 | West |
| 4,873,480 A | 10/1989 | Lafferty |
| 4,888,063 A | 12/1989 | Powell |
| 4,888,702 A | 12/1989 | Gerken et al. |
| 4,899,269 A | 2/1990 | Rouzies |
| 4,903,851 A | 2/1990 | Slough |
| 4,906,859 A | 3/1990 | Kobayashi et al. |
| 4,910,518 A | 3/1990 | Kim et al. |
| 4,951,117 A | 8/1990 | Kasai |
| 4,978,870 A | 12/1990 | Chen et al. |
| 4,987,360 A | 1/1991 | Thompson |
| 5,001,415 A | 3/1991 | Watkinson |
| 5,027,051 A | 6/1991 | Lafferty |
| 5,027,059 A | 6/1991 | de Montgolfier et al. |
| 5,045,988 A | 9/1991 | Gritter et al. |
| 5,081,558 A | 1/1992 | Mahler |
| 5,138,422 A | 8/1992 | Fujii et al. |
| 5,144,222 A | 9/1992 | Herbert |
| 5,155,670 A | 10/1992 | Brian |
| 5,191,519 A | 3/1993 | Kawakami |
| 5,196,781 A | 3/1993 | Jamieson et al. |
| 5,237,194 A | 8/1993 | Takahashi |
| 5,268,832 A | 12/1993 | Kandatsu |
| 5,280,133 A | 1/1994 | Nath |
| 5,280,232 A | 1/1994 | Kohl et al. |
| 5,287,261 A | 2/1994 | Ehsani |
| 5,289,361 A | 2/1994 | Vinciarelli |
| 5,289,998 A | 3/1994 | Bingley et al. |
| 5,327,071 A | 7/1994 | Frederick et al. |
| 5,329,222 A | 7/1994 | Gyugyi et al. |
| 5,345,375 A | 9/1994 | Mohan |
| 5,379,209 A | 1/1995 | Goff |
| 5,381,327 A | 1/1995 | Yan |
| 5,402,060 A | 3/1995 | Erisman |
| 5,404,059 A | 4/1995 | Loffler |
| 5,412,558 A | 5/1995 | Sakurai et al. |
| 5,413,313 A | 5/1995 | Mutterlein et al. |
| 5,446,645 A | 8/1995 | Shirahama et al. |
| 5,460,546 A | 10/1995 | Kunishi et al. |
| 5,493,154 A | 2/1996 | Smith et al. |
| 5,497,289 A | 3/1996 | Sugishima et al. |
| 5,504,418 A | 4/1996 | Ashley |
| 5,504,449 A | 4/1996 | Prentice |
| 5,517,378 A | 5/1996 | Asplund et al. |
| 5,530,335 A | 6/1996 | Decker et al. |
| 5,539,238 A | 7/1996 | Malhi |
| 5,548,504 A | 8/1996 | Takehara |
| 5,563,780 A | 10/1996 | Goad |
| 5,565,855 A | 10/1996 | Knibbe |
| 5,576,941 A | 11/1996 | Nguyen et al. |
| 5,585,749 A | 12/1996 | Pace et al. |

(56) References Cited

U.S. PATENT DOCUMENTS

| | | |
|---|---|---|
| 5,604,430 A | 2/1997 | Decker et al. |
| 5,616,913 A | 4/1997 | Litterst |
| 5,636,107 A | 6/1997 | Lu et al. |
| 5,644,219 A | 7/1997 | Kurokawa |
| 5,646,501 A | 7/1997 | Fishman et al. |
| 5,648,731 A | 7/1997 | Decker et al. |
| 5,659,465 A | 8/1997 | Flack et al. |
| 5,677,833 A | 10/1997 | Bingley |
| 5,684,385 A | 11/1997 | Guyonneau et al. |
| 5,686,766 A | 11/1997 | Tamechika |
| 5,703,390 A | 12/1997 | Itoh |
| 5,708,576 A | 1/1998 | Jones et al. |
| 5,719,758 A | 2/1998 | Nakata et al. |
| 5,722,057 A | 2/1998 | Wu |
| 5,726,615 A | 3/1998 | Bloom |
| 5,731,603 A | 3/1998 | Nakagawa et al. |
| 5,734,565 A | 3/1998 | Mueller et al. |
| 5,747,967 A | 5/1998 | Muljadi et al. |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,793,184 A | 8/1998 | O'Connor |
| 5,798,631 A | 8/1998 | Spee et al. |
| 5,801,519 A | 9/1998 | Midya et al. |
| 5,804,894 A | 9/1998 | Leeson et al. |
| 5,812,045 A | 9/1998 | Ishikawa et al. |
| 5,814,970 A | 9/1998 | Schmidt |
| 5,821,734 A | 10/1998 | Faulk |
| 5,822,186 A | 10/1998 | Bull et al. |
| 5,838,148 A | 11/1998 | Kurokami et al. |
| 5,847,549 A | 12/1998 | Dodson, III |
| 5,859,772 A | 1/1999 | Hilpert |
| 5,869,956 A * | 2/1999 | Nagao .................. G05F 1/67 323/299 |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,898,585 A | 4/1999 | Sirichote et al. |
| 5,903,138 A | 5/1999 | Hwang et al. |
| 5,905,645 A | 5/1999 | Cross |
| 5,917,722 A | 6/1999 | Singh |
| 5,919,314 A | 7/1999 | Kim |
| 5,923,100 A | 7/1999 | Lukens et al. |
| 5,923,158 A | 7/1999 | Kurokami et al. |
| 5,929,614 A | 7/1999 | Copple |
| 5,930,128 A | 7/1999 | Dent |
| 5,930,131 A | 7/1999 | Feng |
| 5,932,994 A | 8/1999 | Jo et al. |
| 5,933,327 A | 8/1999 | Leighton et al. |
| 5,945,806 A | 8/1999 | Faulk |
| 5,946,206 A | 8/1999 | Shimizu et al. |
| 5,949,668 A | 9/1999 | Schweighofer |
| 5,961,739 A | 10/1999 | Osborne |
| 5,963,010 A | 10/1999 | Hayashi et al. |
| 5,963,078 A | 10/1999 | Wallace |
| 5,986,909 A | 11/1999 | Hammond et al. |
| 5,990,659 A | 11/1999 | Frannhagen |
| 6,002,290 A | 12/1999 | Avery et al. |
| 6,021,052 A | 2/2000 | Unger et al. |
| 6,031,736 A | 2/2000 | Takehara et al. |
| 6,037,720 A | 3/2000 | Wong et al. |
| 6,038,148 A | 3/2000 | Farrington et al. |
| 6,046,470 A | 4/2000 | Williams et al. |
| 6,046,919 A | 4/2000 | Madenokouji et al. |
| 6,050,779 A | 4/2000 | Nagao et al. |
| 6,058,035 A | 5/2000 | Madenokouji et al. |
| 6,064,086 A | 5/2000 | Nakagawa et al. |
| 6,078,511 A | 6/2000 | Fasullo et al. |
| 6,081,104 A | 6/2000 | Kern |
| 6,082,122 A | 7/2000 | Madenokouji et al. |
| 6,087,738 A | 7/2000 | Hammond |
| 6,093,885 A | 7/2000 | Takehara et al. |
| 6,094,129 A | 7/2000 | Baiatu |
| 6,101,073 A | 8/2000 | Takehara |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,130,458 A | 10/2000 | Takagi et al. |
| 6,150,739 A | 11/2000 | Baumgartl et al. |
| 6,151,234 A | 11/2000 | Oldenkamp |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,175,219 B1 | 1/2001 | Imamura et al. |
| 6,175,512 B1 | 1/2001 | Hagihara et al. |
| 6,191,456 B1 | 2/2001 | Stoisiek et al. |
| 6,219,623 B1 | 4/2001 | Wills |
| 6,225,793 B1 | 5/2001 | Dickmann |
| 6,255,360 B1 | 7/2001 | Domschke et al. |
| 6,255,804 B1 | 7/2001 | Herniter et al. |
| 6,256,234 B1 | 7/2001 | Keeth et al. |
| 6,259,234 B1 | 7/2001 | Perol |
| 6,262,558 B1 | 7/2001 | Weinberg |
| 6,268,559 B1 | 7/2001 | Yamawaki |
| 6,281,485 B1 | 8/2001 | Siri |
| 6,285,572 B1 | 9/2001 | Onizuka et al. |
| 6,292,379 B1 | 9/2001 | Edevold et al. |
| 6,301,128 B1 | 10/2001 | Jang et al. |
| 6,304,065 B1 | 10/2001 | Wittenbreder |
| 6,307,749 B1 | 10/2001 | Daanen et al. |
| 6,311,137 B1 | 10/2001 | Kurokami et al. |
| 6,316,716 B1 | 11/2001 | Hilgrath |
| 6,320,769 B2 | 11/2001 | Kurokami et al. |
| 6,331,670 B2 | 12/2001 | Takehara et al. |
| 6,339,538 B1 | 1/2002 | Handleman |
| 6,346,451 B1 | 2/2002 | Simpson et al. |
| 6,350,944 B1 | 2/2002 | Sherif et al. |
| 6,351,130 B1 | 2/2002 | Preiser et al. |
| 6,369,461 B1 | 4/2002 | Jungreis et al. |
| 6,369,462 B1 | 4/2002 | Siri |
| 6,380,719 B2 | 4/2002 | Underwood et al. |
| 6,396,170 B1 | 5/2002 | Laufenberg et al. |
| 6,396,239 B1 | 5/2002 | Benn et al. |
| 6,425,248 B1 | 7/2002 | Tonomura et al. |
| 6,429,546 B1 | 8/2002 | Ropp et al. |
| 6,429,621 B1 | 8/2002 | Arai |
| 6,433,522 B1 | 8/2002 | Siri |
| 6,433,978 B1 | 8/2002 | Neiger et al. |
| 6,441,597 B1 | 8/2002 | Lethellier |
| 6,445,599 B1 | 9/2002 | Nguyen |
| 6,448,489 B2 | 9/2002 | Kimura et al. |
| 6,452,814 B1 | 9/2002 | Wittenbreder |
| 6,469,919 B1 | 10/2002 | Bennett |
| 6,472,254 B2 | 10/2002 | Cantarini et al. |
| 6,483,203 B1 | 11/2002 | McCormack |
| 6,493,246 B2 | 12/2002 | Suzui et al. |
| 6,501,362 B1 | 12/2002 | Hoffman et al. |
| 6,507,176 B2 | 1/2003 | Wittenbreder, Jr. |
| 6,509,712 B1 | 1/2003 | Landis |
| 6,515,215 B1 | 2/2003 | Mimura |
| 6,519,165 B2 | 2/2003 | Koike |
| 6,528,977 B2 | 3/2003 | Arakawa |
| 6,531,848 B1 | 3/2003 | Chitsazan et al. |
| 6,545,211 B1 | 4/2003 | Mimura |
| 6,548,205 B2 | 4/2003 | Leung et al. |
| 6,560,131 B1 | 5/2003 | vonBrethorst |
| 6,587,051 B2 | 7/2003 | Takehara et al. |
| 6,590,793 B1 | 7/2003 | Nagao et al. |
| 6,590,794 B1 | 7/2003 | Carter |
| 6,593,520 B2 | 7/2003 | Kondo et al. |
| 6,593,521 B2 | 7/2003 | Kobayashi |
| 6,603,672 B1 | 8/2003 | Deng et al. |
| 6,608,468 B2 | 8/2003 | Nagase |
| 6,611,130 B2 | 8/2003 | Chang |
| 6,611,441 B2 | 8/2003 | Kurokami et al. |
| 6,628,011 B2 | 9/2003 | Droppo et al. |
| 6,633,824 B2 | 10/2003 | Dollar, II |
| 6,650,031 B1 | 11/2003 | Goldack |
| 6,650,560 B2 | 11/2003 | MacDonald et al. |
| 6,653,549 B2 | 11/2003 | Matsushita et al. |

(56) References Cited

U.S. PATENT DOCUMENTS

| | | |
|---|---|---|
| 6,657,419 B2 | 12/2003 | Renyolds |
| 6,672,018 B2 | 1/2004 | Shingleton |
| 6,678,174 B2 | 1/2004 | Suzui et al. |
| 6,690,590 B2 | 2/2004 | Stamenic et al. |
| 6,693,327 B2 | 2/2004 | Priefert et al. |
| 6,693,781 B1 | 2/2004 | Kroker |
| 6,709,291 B1 | 3/2004 | Wallace et al. |
| 6,731,136 B2 | 5/2004 | Knee |
| 6,738,692 B2 | 5/2004 | Schienbein et al. |
| 6,744,643 B2 | 6/2004 | Luo et al. |
| 6,765,315 B2 | 7/2004 | Hammerstrom et al. |
| 6,768,047 B2 | 7/2004 | Chang et al. |
| 6,768,180 B2 | 7/2004 | Salama et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,800,964 B2 | 10/2004 | Beck |
| 6,801,442 B2 | 10/2004 | Suzui et al. |
| 6,807,069 B2 | 10/2004 | Nieminen et al. |
| 6,809,942 B2 | 10/2004 | Madenokouji et al. |
| 6,810,339 B2 | 10/2004 | Wills |
| 6,812,396 B2 | 11/2004 | Makita et al. |
| 6,828,503 B2 | 12/2004 | Yoshikawa et al. |
| 6,837,739 B2 | 1/2005 | Gorringe et al. |
| 6,838,611 B2 | 1/2005 | Kondo et al. |
| 6,842,354 B1 | 1/2005 | Tallam et al. |
| 6,850,074 B2 | 2/2005 | Adams et al. |
| 6,856,102 B1 | 2/2005 | Lin et al. |
| 6,882,131 B1 | 4/2005 | Takada et al. |
| 6,888,728 B2 | 5/2005 | Takagi et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,933,714 B2 | 8/2005 | Fasshauer et al. |
| 6,936,995 B2 | 8/2005 | Kapsokavathis et al. |
| 6,940,735 B2 | 9/2005 | Deng et al. |
| 6,949,843 B2 | 9/2005 | Dubovsky |
| 6,950,323 B2 | 9/2005 | Achleitner et al. |
| 6,963,147 B2 | 11/2005 | Kurokami et al. |
| 6,966,184 B2 | 11/2005 | Toyomura et al. |
| 6,980,783 B2 | 12/2005 | Liu et al. |
| 6,984,967 B2 | 1/2006 | Notman |
| 6,984,970 B2 | 1/2006 | Capel |
| 6,996,741 B1 | 2/2006 | Pittelkow et al. |
| 7,030,597 B2 | 4/2006 | Bruno et al. |
| 7,031,176 B2 | 4/2006 | Kotsopoulos et al. |
| 7,038,430 B2 | 5/2006 | Itabashi et al. |
| 7,042,195 B2 | 5/2006 | Tsunetsugu et al. |
| 7,045,991 B2 | 5/2006 | Nakamura et al. |
| 7,046,531 B2 | 5/2006 | Zocchi et al. |
| 7,053,506 B2 | 5/2006 | Alonso et al. |
| 7,061,211 B2 | 6/2006 | Satoh et al. |
| 7,061,214 B2 | 6/2006 | Mayega et al. |
| 7,064,967 B2 | 6/2006 | Ichinose et al. |
| 7,068,017 B2 | 6/2006 | Willner et al. |
| 7,072,194 B2 | 7/2006 | Nayar et al. |
| 7,078,883 B2 | 7/2006 | Chapman et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,091,707 B2 | 8/2006 | Cutler |
| 7,097,516 B2 | 8/2006 | Werner et al. |
| 7,099,169 B2 | 8/2006 | West et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,142,997 B1 | 11/2006 | Widner |
| 7,148,669 B2 | 12/2006 | Maksimovic et al. |
| 7,158,359 B2 | 1/2007 | Bertele et al. |
| 7,158,395 B2 | 1/2007 | Deng et al. |
| 7,161,082 B2 | 1/2007 | Matsushita et al. |
| 7,174,973 B1 | 2/2007 | Lysaght |
| 7,183,667 B2 | 2/2007 | Colby et al. |
| 7,193,872 B2 | 3/2007 | Siri |
| 7,202,653 B2 | 4/2007 | Pai |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,259,474 B2 | 8/2007 | Blanc |
| 7,262,979 B2 | 8/2007 | Wai et al. |
| 7,276,886 B2 | 10/2007 | Kinder et al. |
| 7,277,304 B2 | 10/2007 | Stancu et al. |
| 7,281,141 B2 | 10/2007 | Elkayam et al. |
| 7,282,814 B2 | 10/2007 | Jacobs |
| 7,291,036 B1 | 11/2007 | Daily et al. |
| RE39,976 E | 1/2008 | Schiff et al. |
| 7,315,052 B2 | 1/2008 | Alter |
| 7,319,313 B2 | 1/2008 | Dickerson et al. |
| 7,324,361 B2 | 1/2008 | Siri |
| 7,336,004 B2 | 2/2008 | Lai |
| 7,336,056 B1 | 2/2008 | Dening |
| 7,339,287 B2 | 3/2008 | Jepsen et al. |
| 7,348,802 B2 | 3/2008 | Kasanyal et al. |
| 7,352,154 B2 | 4/2008 | Cook |
| 7,361,952 B2 | 4/2008 | Miura et al. |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,388,348 B2 | 6/2008 | Mattichak |
| 7,394,237 B2 | 7/2008 | Chou et al. |
| 7,405,117 B2 | 7/2008 | Zuniga et al. |
| 7,414,870 B2 | 8/2008 | Rottger et al. |
| 7,420,354 B2 | 9/2008 | Cutler |
| 7,420,815 B2 | 9/2008 | Love |
| 7,432,691 B2 | 10/2008 | Cutler |
| 7,435,134 B2 | 10/2008 | Lenox |
| 7,435,897 B2 | 10/2008 | Russell |
| 7,443,052 B2 | 10/2008 | Wendt et al. |
| 7,443,152 B2 | 10/2008 | Utsunomiya |
| 7,450,401 B2 | 11/2008 | Iida |
| 7,456,523 B2 | 11/2008 | Kobayashi |
| 7,463,500 B2 | 12/2008 | West |
| 7,466,566 B2 | 12/2008 | Fukumoto |
| 7,471,014 B2 | 12/2008 | Lum et al. |
| 7,471,524 B1 | 12/2008 | Batarseh et al. |
| 7,479,774 B2 | 1/2009 | Wai et al. |
| 7,482,238 B2 | 1/2009 | Sung |
| 7,485,987 B2 | 2/2009 | Mori et al. |
| 7,495,419 B1 | 2/2009 | Ju |
| 7,504,811 B2 | 3/2009 | Watanabe et al. |
| 7,518,346 B2 | 4/2009 | Prexl et al. |
| 7,538,451 B2 | 5/2009 | Nomoto |
| 7,560,915 B2 | 7/2009 | Ito et al. |
| 7,589,437 B2 | 9/2009 | Henne et al. |
| 7,595,616 B2 | 9/2009 | Prexl et al. |
| 7,599,200 B2 | 10/2009 | Tomonaga |
| 7,600,349 B2 | 10/2009 | Liebendorfer |
| 7,602,080 B1 | 10/2009 | Hadar et al. |
| 7,605,498 B2 | 10/2009 | Ledenev et al. |
| 7,612,283 B2 | 11/2009 | Toyomura et al. |
| 7,626,834 B2 | 12/2009 | Chisenga et al. |
| 7,646,116 B2 | 1/2010 | Batarseh et al. |
| 7,649,434 B2 | 1/2010 | Xu et al. |
| 7,701,083 B2 | 4/2010 | Savage |
| 7,709,727 B2 | 5/2010 | Roehrig et al. |
| 7,719,140 B2 | 5/2010 | Ledenev et al. |
| 7,723,865 B2 | 5/2010 | Kitanaka |
| 7,733,069 B2 | 6/2010 | Toyomura et al. |
| 7,748,175 B2 | 7/2010 | Liebendorfer |
| 7,759,575 B2 | 7/2010 | Jones et al. |
| 7,763,807 B2 | 7/2010 | Richter |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,807,919 B2 | 10/2010 | Powell et al. |
| 7,808,125 B1 | 10/2010 | Sachdeva et al. |
| 7,812,701 B2 | 10/2010 | Lee et al. |
| 7,821,225 B2 | 10/2010 | Chou et al. |
| 7,839,022 B2 | 11/2010 | Wolfs |
| 7,843,085 B2 | 11/2010 | Ledenev et al. |

(56) References Cited

U.S. PATENT DOCUMENTS

| | | |
|---|---|---|
| 7,864,497 B2 | 1/2011 | Quardt et al. |
| 7,868,599 B2 | 1/2011 | Rahman et al. |
| 7,880,334 B2 | 2/2011 | Evans et al. |
| 7,883,808 B2 | 2/2011 | Norimatsu et al. |
| 7,884,278 B2 | 2/2011 | Powell et al. |
| 7,893,346 B2 | 2/2011 | Nachamkin et al. |
| 7,898,112 B2 | 3/2011 | Powell et al. |
| 7,900,361 B2 | 3/2011 | Adest et al. |
| 7,906,870 B2 | 3/2011 | Ohm |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 7,969,133 B2 | 6/2011 | Zhang et al. |
| 8,003,885 B2 | 8/2011 | Richter et al. |
| 8,004,113 B2 | 8/2011 | Sander et al. |
| 8,004,116 B2 | 8/2011 | Ledenev et al. |
| 8,004,117 B2 | 8/2011 | Adest et al. |
| 8,004,866 B2 | 8/2011 | Bucella et al. |
| 8,013,472 B2 | 9/2011 | Adest et al. |
| 8,018,748 B2 | 9/2011 | Leonard |
| 8,039,730 B2 | 10/2011 | Hadar et al. |
| 8,058,747 B2 | 11/2011 | Avrutsky et al. |
| 8,058,752 B2 | 11/2011 | Erickson, Jr. et al. |
| 8,067,855 B2 | 11/2011 | Mumtaz et al. |
| 8,077,437 B2 | 12/2011 | Mumtaz et al. |
| 8,089,780 B2 | 1/2012 | Mochikawa et al. |
| 8,089,785 B2 | 1/2012 | Rodriguez |
| 8,090,548 B2 | 1/2012 | Abdennadher et al. |
| 8,093,756 B2 | 1/2012 | Porter et al. |
| 8,093,757 B2 | 1/2012 | Wolfs |
| 8,098,055 B2 | 1/2012 | Avrutsky et al. |
| 8,102,074 B2 | 1/2012 | Hadar et al. |
| 8,102,144 B2 | 1/2012 | Capp et al. |
| 8,111,052 B2 | 2/2012 | Glovinsky |
| 8,116,103 B2 | 2/2012 | Zacharias et al. |
| 8,138,631 B2 | 3/2012 | Allen et al. |
| 8,138,914 B2 | 3/2012 | Wong et al. |
| 8,158,877 B2 | 4/2012 | Klein et al. |
| 8,179,147 B2 | 5/2012 | Dargatz et al. |
| 8,184,460 B2 | 5/2012 | O'Brien et al. |
| 8,204,709 B2 | 6/2012 | Presher, Jr. et al. |
| 8,212,408 B2 | 7/2012 | Fishman |
| 8,212,409 B2 | 7/2012 | Bettenwort et al. |
| 8,271,599 B2 | 9/2012 | Eizips et al. |
| 8,274,172 B2 | 9/2012 | Hadar et al. |
| 8,279,644 B2 | 10/2012 | Zhang et al. |
| 8,289,742 B2 | 10/2012 | Adest et al. |
| 8,304,932 B2 | 11/2012 | Ledenev et al. |
| 8,310,101 B2 | 11/2012 | Amaratunga et al. |
| 8,310,102 B2 | 11/2012 | Raju |
| 8,314,375 B2 | 11/2012 | Arditi et al. |
| 8,325,059 B2 | 12/2012 | Rozenboim |
| 8,369,113 B2 | 2/2013 | Rodriguez |
| 8,405,248 B2 | 3/2013 | Mumtaz et al. |
| 8,405,349 B2 | 3/2013 | Kikinis et al. |
| 8,405,367 B2 | 3/2013 | Chisenga et al. |
| 8,415,552 B2 | 4/2013 | Hadar et al. |
| 8,415,937 B2 | 4/2013 | Hester |
| 8,436,592 B2 | 5/2013 | Saitoh |
| 8,461,809 B2 | 6/2013 | Rodriguez |
| 8,473,250 B2 | 6/2013 | Adest et al. |
| 8,509,032 B2 | 8/2013 | Rakib |
| 8,570,017 B2 | 10/2013 | Perichon et al. |
| 8,581,441 B2 | 11/2013 | Rotzoll et al. |
| 8,653,689 B2 | 2/2014 | Rozenboim |
| 8,669,675 B2 | 3/2014 | Capp et al. |
| 8,686,333 B2 | 4/2014 | Arditi et al. |
| 8,751,053 B2 | 6/2014 | Hadar et al. |
| 8,773,236 B2 | 7/2014 | Makhota et al. |
| 8,811,047 B2 | 8/2014 | Rodriguez |
| 8,823,218 B2 | 9/2014 | Hadar et al. |
| 8,823,342 B2 | 9/2014 | Williams |
| 8,841,916 B2 | 9/2014 | Avrutsky |
| 8,853,886 B2 | 10/2014 | Avrutsky et al. |
| 8,854,193 B2 | 10/2014 | Makhota et al. |
| 8,860,241 B2 | 10/2014 | Hadar et al. |
| 8,860,246 B2 | 10/2014 | Hadar et al. |
| 8,922,061 B2 | 12/2014 | Arditi |
| 8,933,321 B2 | 1/2015 | Hadar et al. |
| 2001/0023703 A1 | 9/2001 | Kondo et al. |
| 2001/0032664 A1 | 10/2001 | Takehara et al. |
| 2001/0034982 A1 | 11/2001 | Nagao et al. |
| 2001/0035180 A1 | 11/2001 | Kimura et al. |
| 2001/0048605 A1 | 12/2001 | Kurokami et al. |
| 2001/0050102 A1 | 12/2001 | Matsumi et al. |
| 2001/0054881 A1 | 12/2001 | Watanabe |
| 2002/0014262 A1 | 2/2002 | Matsushita et al. |
| 2002/0034083 A1 | 3/2002 | Ayyanar et al. |
| 2002/0038667 A1 | 4/2002 | Kondo et al. |
| 2002/0041505 A1 | 4/2002 | Suzui et al. |
| 2002/0044473 A1 | 4/2002 | Toyomura et al. |
| 2002/0047309 A1 | 4/2002 | Droppo et al. |
| 2002/0056089 A1 | 5/2002 | Houston |
| 2002/0063552 A1 | 5/2002 | Arakawa |
| 2002/0078991 A1 | 6/2002 | Nagao et al. |
| 2002/0080027 A1 | 6/2002 | Conley |
| 2002/0118559 A1 | 8/2002 | Kurokami et al. |
| 2002/0134567 A1 | 9/2002 | Rasmussen et al. |
| 2002/0148497 A1 | 10/2002 | Sasaoka et al. |
| 2002/0149950 A1 | 10/2002 | Takebayashi |
| 2002/0165458 A1 | 11/2002 | Carter et al. |
| 2002/0177401 A1 | 11/2002 | Judd et al. |
| 2002/0179140 A1 | 12/2002 | Toyomura |
| 2002/0180408 A1 | 12/2002 | McDaniel et al. |
| 2003/0038615 A1 | 2/2003 | Elbanhawy |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0066555 A1 | 4/2003 | Hui et al. |
| 2003/0075211 A1 | 4/2003 | Makita et al. |
| 2003/0080741 A1 | 5/2003 | LeRow et al. |
| 2003/0085621 A1 | 5/2003 | Potega |
| 2003/0090233 A1 | 5/2003 | Browe |
| 2003/0094931 A1 | 5/2003 | Renyolds |
| 2003/0107352 A1 | 6/2003 | Downer et al. |
| 2003/0156439 A1 | 8/2003 | Ohmichi et al. |
| 2003/0164695 A1 | 9/2003 | Fasshauer et al. |
| 2003/0185026 A1 | 10/2003 | Matsuda et al. |
| 2003/0193821 A1 | 10/2003 | Krieger et al. |
| 2003/0201674 A1 | 10/2003 | Droppo et al. |
| 2003/0214274 A1 | 11/2003 | Lethellier |
| 2003/0223257 A1 | 12/2003 | Onoe |
| 2004/0004402 A1 | 1/2004 | Kippley |
| 2004/0041548 A1 | 3/2004 | Perry |
| 2004/0056768 A1 | 3/2004 | Matsushita et al. |
| 2004/0061527 A1 | 4/2004 | Knee |
| 2004/0076028 A1 | 4/2004 | Achleitner et al. |
| 2004/0117676 A1 | 6/2004 | Kobayashi et al. |
| 2004/0118446 A1 | 6/2004 | Toyomura |
| 2004/0123894 A1 | 7/2004 | Erban |
| 2004/0124816 A1 | 7/2004 | DeLepaut |
| 2004/0125618 A1 | 7/2004 | De Rooij et al. |
| 2004/0140719 A1 | 7/2004 | Vulih et al. |
| 2004/0164718 A1 | 8/2004 | McDaniel et al. |
| 2004/0165408 A1 | 8/2004 | West et al. |
| 2004/0169499 A1 | 9/2004 | Huang et al. |
| 2004/0170038 A1 | 9/2004 | Ichinose et al. |
| 2004/0189432 A1 | 9/2004 | Yan et al. |
| 2004/0201279 A1 | 10/2004 | Templeton |
| 2004/0201933 A1 | 10/2004 | Blanc |
| 2004/0207366 A1 | 10/2004 | Sung |
| 2004/0211458 A1 | 10/2004 | Gui et al. |
| 2004/0223351 A1 | 11/2004 | Kurokami et al. |
| 2004/0230343 A1 | 11/2004 | Zalesski |
| 2004/0233685 A1 | 11/2004 | Matsuo et al. |
| 2004/0246226 A1 | 12/2004 | Moon |
| 2004/0258141 A1 | 12/2004 | Tustison et al. |
| 2004/0264225 A1 | 12/2004 | Bhavaraju et al. |

(56) References Cited

U.S. PATENT DOCUMENTS

| | | |
|---|---|---|
| 2005/0002214 A1 | 1/2005 | Deng et al. |
| 2005/0005785 A1 | 1/2005 | Poss et al. |
| 2005/0006958 A1 | 1/2005 | Dubovsky |
| 2005/0017697 A1 | 1/2005 | Capel |
| 2005/0017701 A1 | 1/2005 | Hsu |
| 2005/0030772 A1 | 2/2005 | Phadke |
| 2005/0040800 A1 | 2/2005 | Sutardja |
| 2005/0057214 A1 | 3/2005 | Matan |
| 2005/0057215 A1 | 3/2005 | Matan |
| 2005/0068012 A1 | 3/2005 | Cutler |
| 2005/0068820 A1 | 3/2005 | Radosevich et al. |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0105306 A1 | 5/2005 | Deng et al. |
| 2005/0110454 A1 | 5/2005 | Tsai et al. |
| 2005/0121067 A1 | 6/2005 | Toyomura et al. |
| 2005/0135031 A1 | 6/2005 | Colby et al. |
| 2005/0139258 A1 | 6/2005 | Liu et al. |
| 2005/0162018 A1 | 7/2005 | Realmuto et al. |
| 2005/0172995 A1 | 8/2005 | Rohrig et al. |
| 2005/0179420 A1 | 8/2005 | Satoh et al. |
| 2005/0194937 A1 | 9/2005 | Jacobs |
| 2005/0201397 A1 | 9/2005 | Petite |
| 2005/0213272 A1 | 9/2005 | Kobayashi |
| 2005/0225090 A1 | 10/2005 | Wobben |
| 2005/0226017 A1 | 10/2005 | Kotsopoulos et al. |
| 2005/0242795 A1 | 11/2005 | Al-Kuran et al. |
| 2005/0257827 A1 | 11/2005 | Gaudiana et al. |
| 2005/0269988 A1 | 12/2005 | Thrap |
| 2005/0275386 A1 | 12/2005 | Jepsen et al. |
| 2005/0275527 A1 | 12/2005 | Kates |
| 2005/0275979 A1 | 12/2005 | Xu |
| 2005/0281064 A1 | 12/2005 | Olsen et al. |
| 2006/0001406 A1 | 1/2006 | Matan |
| 2006/0017327 A1 | 1/2006 | Siri et al. |
| 2006/0034106 A1 | 2/2006 | Johnson |
| 2006/0038692 A1 | 2/2006 | Schnetker |
| 2006/0043792 A1 | 3/2006 | Hjort et al. |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0103360 A9 | 5/2006 | Cutler |
| 2006/0108979 A1 | 5/2006 | Daniel et al. |
| 2006/0113843 A1 | 6/2006 | Beveridge |
| 2006/0113979 A1 | 6/2006 | Ishigaki et al. |
| 2006/0118162 A1 | 6/2006 | Saelzer et al. |
| 2006/0132102 A1 | 6/2006 | Harvey |
| 2006/0149396 A1 | 7/2006 | Templeton |
| 2006/0162772 A1 | 7/2006 | Presher et al. |
| 2006/0163946 A1 | 7/2006 | Henne et al. |
| 2006/0164065 A1 | 7/2006 | Hoouk et al. |
| 2006/0171182 A1 | 8/2006 | Siri et al. |
| 2006/0174939 A1 | 8/2006 | Matan |
| 2006/0176029 A1 | 8/2006 | McGinty et al. |
| 2006/0176031 A1 | 8/2006 | Forman et al. |
| 2006/0176036 A1 | 8/2006 | Flatness et al. |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0222916 A1 | 10/2006 | Norimatsu et al. |
| 2006/0227578 A1 | 10/2006 | Datta et al. |
| 2006/0231132 A1 | 10/2006 | Neussner |
| 2006/0232220 A1 | 10/2006 | Melis |
| 2006/0237058 A1 | 10/2006 | McClintock et al. |
| 2006/0261751 A1 | 11/2006 | Okabe et al. |
| 2006/0290317 A1 | 12/2006 | McNulty et al. |
| 2007/0001653 A1 | 1/2007 | Xu |
| 2007/0013349 A1 | 1/2007 | Bassett |
| 2007/0019613 A1 | 1/2007 | Frezzolini |
| 2007/0024257 A1 | 2/2007 | Boldo |
| 2007/0027644 A1 | 2/2007 | Bettenwort et al. |
| 2007/0030068 A1 | 2/2007 | Motonobu et al. |
| 2007/0035975 A1 | 2/2007 | Dickerson et al. |
| 2007/0040540 A1 | 2/2007 | Cutler |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0103108 A1 | 5/2007 | Capp et al. |
| 2007/0107767 A1 | 5/2007 | Hayden et al. |
| 2007/0115635 A1 | 5/2007 | Low et al. |
| 2007/0119718 A1 | 5/2007 | Gibson et al. |
| 2007/0121648 A1 | 5/2007 | Hahn |
| 2007/0133241 A1 | 6/2007 | Mumtaz et al. |
| 2007/0133421 A1 | 6/2007 | Young |
| 2007/0147075 A1 | 6/2007 | Bang |
| 2007/0158185 A1 | 7/2007 | Andelman et al. |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0209656 A1 | 9/2007 | Lee |
| 2007/0211888 A1 | 9/2007 | Corcoran et al. |
| 2007/0227574 A1 | 10/2007 | Cart |
| 2007/0235071 A1 | 10/2007 | Work et al. |
| 2007/0236187 A1 | 10/2007 | Wai et al. |
| 2007/0247877 A1 | 10/2007 | Kwon et al. |
| 2007/0271006 A1 | 11/2007 | Golden et al. |
| 2007/0273339 A1* | 11/2007 | Haines .................. B64G 1/443 323/223 |
| 2007/0273342 A1 | 11/2007 | Kataoka et al. |
| 2007/0273351 A1 | 11/2007 | Matan |
| 2007/0290636 A1 | 12/2007 | Beck et al. |
| 2007/0290656 A1 | 12/2007 | Lee Tai Keung |
| 2008/0021707 A1 | 1/2008 | Bou-Ghazale et al. |
| 2008/0024098 A1 | 1/2008 | Hojo |
| 2008/0036440 A1 | 2/2008 | Garmer |
| 2008/0055941 A1 | 3/2008 | Victor et al. |
| 2008/0080177 A1 | 4/2008 | Chang |
| 2008/0088184 A1 | 4/2008 | Tung et al. |
| 2008/0089277 A1 | 4/2008 | Alexander et al. |
| 2008/0097655 A1 | 4/2008 | Hadar et al. |
| 2008/0106250 A1 | 5/2008 | Prior et al. |
| 2008/0111529 A1 | 5/2008 | Shah et al. |
| 2008/0115823 A1 | 5/2008 | Kinsey |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0136367 A1 | 6/2008 | Adest et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0149167 A1 | 6/2008 | Liu |
| 2008/0150366 A1 | 6/2008 | Adest et al. |
| 2008/0150484 A1 | 6/2008 | Kimball et al. |
| 2008/0164766 A1 | 7/2008 | Adest et al. |
| 2008/0179949 A1 | 7/2008 | Besser et al. |
| 2008/0186004 A1 | 8/2008 | Williams |
| 2008/0191560 A1 | 8/2008 | Besser et al. |
| 2008/0191675 A1 | 8/2008 | Besser et al. |
| 2008/0198523 A1 | 8/2008 | Schmidt et al. |
| 2008/0205096 A1 | 8/2008 | Lai et al. |
| 2008/0218152 A1 | 9/2008 | Bo |
| 2008/0224652 A1 | 9/2008 | Zhu et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0238372 A1 | 10/2008 | Cintra et al. |
| 2008/0246460 A1 | 10/2008 | Smith |
| 2008/0246463 A1 | 10/2008 | Sinton et al. |
| 2008/0252273 A1 | 10/2008 | Woo et al. |
| 2008/0264470 A1 | 10/2008 | Masuda et al. |
| 2008/0266919 A1 | 10/2008 | Mallwitz |
| 2008/0291707 A1 | 11/2008 | Fang |
| 2008/0294472 A1 | 11/2008 | Yamada |
| 2008/0297963 A1 | 12/2008 | Lee et al. |
| 2008/0303503 A1 | 12/2008 | Wolfs |
| 2008/0304296 A1 | 12/2008 | NadimpalliRaju et al. |
| 2008/0304298 A1 | 12/2008 | Toba et al. |
| 2009/0012917 A1 | 1/2009 | Thompson et al. |

(56) References Cited

U.S. PATENT DOCUMENTS

| | | |
|---|---|---|
| 2009/0014050 A1 | 1/2009 | Haaf |
| 2009/0015071 A1 | 1/2009 | Iwata et al. |
| 2009/0020151 A1 | 1/2009 | Fornage |
| 2009/0021877 A1 | 1/2009 | Fornage et al. |
| 2009/0039852 A1 | 2/2009 | Fishelov et al. |
| 2009/0066357 A1 | 3/2009 | Fornage |
| 2009/0066399 A1 | 3/2009 | Chen et al. |
| 2009/0069950 A1 | 3/2009 | Kurokami et al. |
| 2009/0073726 A1 | 3/2009 | Babcock |
| 2009/0080226 A1 | 3/2009 | Fornage |
| 2009/0084570 A1 | 4/2009 | Gherardini et al. |
| 2009/0097172 A1 | 4/2009 | Bremicker et al. |
| 2009/0101191 A1 | 4/2009 | Beck et al. |
| 2009/0102440 A1 | 4/2009 | Coles |
| 2009/0114263 A1 | 5/2009 | Powell et al. |
| 2009/0120485 A1 | 5/2009 | Kikinis |
| 2009/0121549 A1 | 5/2009 | Leonard |
| 2009/0133736 A1 | 5/2009 | Powell et al. |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0150005 A1 | 6/2009 | Hadar et al. |
| 2009/0179500 A1 | 7/2009 | Ragonese et al. |
| 2009/0179662 A1 | 7/2009 | Moulton et al. |
| 2009/0182532 A1 | 7/2009 | Stoeber et al. |
| 2009/0184746 A1 | 7/2009 | Fahrenbruch |
| 2009/0189456 A1 | 7/2009 | Skutt |
| 2009/0190275 A1 | 7/2009 | Gilmore et al. |
| 2009/0195081 A1 | 8/2009 | Quardt et al. |
| 2009/0206666 A1 | 8/2009 | Sella et al. |
| 2009/0207543 A1 | 8/2009 | Boniface et al. |
| 2009/0217965 A1 | 9/2009 | Dougal et al. |
| 2009/0224817 A1 | 9/2009 | Nakamura et al. |
| 2009/0234692 A1 | 9/2009 | Powell et al. |
| 2009/0237042 A1 | 9/2009 | Glovinski |
| 2009/0237043 A1 | 9/2009 | Glovinsky |
| 2009/0242011 A1 | 10/2009 | Proisy et al. |
| 2009/0243547 A1 | 10/2009 | Andelfinger |
| 2009/0273241 A1 | 11/2009 | Gazit et al. |
| 2009/0278496 A1 | 11/2009 | Nakao et al. |
| 2009/0282755 A1 | 11/2009 | Abbott et al. |
| 2009/0283129 A1 | 11/2009 | Foss |
| 2009/0283130 A1 | 11/2009 | Gilmore et al. |
| 2009/0284232 A1 | 11/2009 | Zhang et al. |
| 2009/0284998 A1 | 11/2009 | Zhang et al. |
| 2009/0295225 A1 | 12/2009 | Asplund et al. |
| 2009/0322494 A1 | 12/2009 | Lee |
| 2010/0001587 A1 | 1/2010 | Casey et al. |
| 2010/0002349 A1 | 1/2010 | La Scala et al. |
| 2010/0013452 A1 | 1/2010 | Tang et al. |
| 2010/0026097 A1 | 2/2010 | Avrutsky et al. |
| 2010/0052735 A1 | 3/2010 | Burkland et al. |
| 2010/0057267 A1 | 3/2010 | Liu et al. |
| 2010/0060000 A1 | 3/2010 | Scholte-Wassink |
| 2010/0085670 A1 | 4/2010 | Palaniswami et al. |
| 2010/0115093 A1 | 5/2010 | Rice |
| 2010/0124027 A1 | 5/2010 | Handelsman et al. |
| 2010/0127570 A1 | 5/2010 | Hadar et al. |
| 2010/0127571 A1 | 5/2010 | Hadar et al. |
| 2010/0132757 A1 | 6/2010 | He et al. |
| 2010/0132758 A1 | 6/2010 | Gilmore |
| 2010/0133911 A1 | 6/2010 | Williams et al. |
| 2010/0139734 A1 | 6/2010 | Hadar et al. |
| 2010/0139743 A1 | 6/2010 | Hadar et al. |
| 2010/0176773 A1 | 7/2010 | Capel |
| 2010/0181957 A1 | 7/2010 | Goeltner |
| 2010/0191383 A1 | 7/2010 | Gaul |
| 2010/0207764 A1 | 8/2010 | Muhlberger et al. |
| 2010/0207770 A1 | 8/2010 | Thiemann |
| 2010/0208501 A1 | 8/2010 | Matan et al. |
| 2010/0214808 A1 | 8/2010 | Rodriguez |
| 2010/0229915 A1 | 9/2010 | Ledenev et al. |
| 2010/0244575 A1 | 9/2010 | Coccia et al. |
| 2010/0246223 A1 | 9/2010 | Xuan |
| 2010/0264736 A1 | 10/2010 | Mumtaz et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0288327 A1 | 11/2010 | Lisi et al. |
| 2010/0294528 A1 | 11/2010 | Sella et al. |
| 2010/0294903 A1 | 11/2010 | Shmukler et al. |
| 2010/0295680 A1 | 11/2010 | Dumps |
| 2010/0297860 A1 | 11/2010 | Shmukler et al. |
| 2010/0301991 A1 | 12/2010 | Sella et al. |
| 2010/0308662 A1 | 12/2010 | Schatz et al. |
| 2010/0309692 A1 | 12/2010 | Chisenga et al. |
| 2010/0321148 A1 | 12/2010 | Gevorkian |
| 2010/0326809 A1 | 12/2010 | Lang et al. |
| 2010/0327657 A1 | 12/2010 | Kuran |
| 2010/0327659 A1 | 12/2010 | Lisi et al. |
| 2010/0332047 A1 | 12/2010 | Arditi et al. |
| 2011/0006743 A1 | 1/2011 | Fabbro |
| 2011/0012430 A1 | 1/2011 | Cheng et al. |
| 2011/0025130 A1 | 2/2011 | Hadar et al. |
| 2011/0031816 A1 | 2/2011 | Buthker et al. |
| 2011/0031946 A1 | 2/2011 | Egan et al. |
| 2011/0037600 A1 | 2/2011 | Takehara et al. |
| 2011/0043172 A1 | 2/2011 | Dearn |
| 2011/0049990 A1 | 3/2011 | Amaratunga et al. |
| 2011/0050190 A1 | 3/2011 | Avrutsky |
| 2011/0056533 A1 | 3/2011 | Kuan |
| 2011/0061713 A1 | 3/2011 | Powell et al. |
| 2011/0062784 A1 | 3/2011 | Wolfs |
| 2011/0079263 A1 | 4/2011 | Avrutsky |
| 2011/0083733 A1 | 4/2011 | Marroquin et al. |
| 2011/0084553 A1 | 4/2011 | Adest et al. |
| 2011/0114154 A1 | 5/2011 | Lichy et al. |
| 2011/0115295 A1 | 5/2011 | Moon et al. |
| 2011/0121652 A1 | 5/2011 | Sella et al. |
| 2011/0125431 A1 | 5/2011 | Adest et al. |
| 2011/0132424 A1 | 6/2011 | Rakib |
| 2011/0133552 A1 | 6/2011 | Binder et al. |
| 2011/0139213 A1 | 6/2011 | Lee |
| 2011/0140536 A1 | 6/2011 | Adest et al. |
| 2011/0161722 A1 | 6/2011 | Makhota et al. |
| 2011/0172842 A1 | 7/2011 | Makhota et al. |
| 2011/0173276 A1 | 7/2011 | Eizips et al. |
| 2011/0181251 A1 | 7/2011 | Porter et al. |
| 2011/0181340 A1 | 7/2011 | Gazit |
| 2011/0210610 A1 | 9/2011 | Mitsuoka et al. |
| 2011/0210611 A1 | 9/2011 | Ledenev et al. |
| 2011/0210612 A1 | 9/2011 | Leutwein |
| 2011/0218687 A1 | 9/2011 | Hadar et al. |
| 2011/0227411 A1 | 9/2011 | Arditi |
| 2011/0232714 A1 | 9/2011 | Bhavaraju et al. |
| 2011/0245989 A1 | 10/2011 | Makhota et al. |
| 2011/0246338 A1 | 10/2011 | Eich |
| 2011/0254372 A1 | 10/2011 | Haines et al. |
| 2011/0260866 A1 | 10/2011 | Avrutsky et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0273302 A1 | 11/2011 | Fornage et al. |
| 2011/0285205 A1 | 11/2011 | Ledenev et al. |
| 2011/0290317 A1 | 12/2011 | Naumovitz et al. |
| 2011/0291486 A1 | 12/2011 | Adest et al. |
| 2011/0301772 A1 | 12/2011 | Zuercher et al. |
| 2011/0304204 A1 | 12/2011 | Avrutsky et al. |
| 2011/0304213 A1 | 12/2011 | Avrutsky et al. |
| 2011/0304215 A1 | 12/2011 | Avrutsky et al. |
| 2011/0316346 A1 | 12/2011 | Porter et al. |
| 2012/0007613 A1 | 1/2012 | Gazit |
| 2012/0019966 A1 | 1/2012 | DeBoer |
| 2012/0032515 A1 | 2/2012 | Ledenev et al. |
| 2012/0033463 A1 | 2/2012 | Rodriguez |
| 2012/0039099 A1 | 2/2012 | Rodriguez |
| 2012/0043818 A1 | 2/2012 | Stratakos et al. |
| 2012/0044014 A1 | 2/2012 | Stratakos et al. |
| 2012/0048325 A1 | 3/2012 | Matsuo et al. |

(56) References Cited

U.S. PATENT DOCUMENTS

| | | | |
|---|---|---|---|
| 2012/0049627 A1 | 3/2012 | Matsuo et al. |
| 2012/0049801 A1 | 3/2012 | Chang |
| 2012/0056483 A1 | 3/2012 | Capp et al. |
| 2012/0081009 A1 | 4/2012 | Shteynberg et al. |
| 2012/0081934 A1 | 4/2012 | Garrity et al. |
| 2012/0087159 A1 | 4/2012 | Chapman et al. |
| 2012/0091810 A1 | 4/2012 | Aiello et al. |
| 2012/0098344 A1 | 4/2012 | Bergveld et al. |
| 2012/0113554 A1 | 5/2012 | Paoletti et al. |
| 2012/0119584 A1 | 5/2012 | Hadar et al. |
| 2012/0146420 A1 | 6/2012 | Wolfs |
| 2012/0146583 A1 | 6/2012 | Gaul et al. |
| 2012/0161526 A1 | 6/2012 | Huang et al. |
| 2012/0161528 A1 | 6/2012 | Mumtaz et al. |
| 2012/0169124 A1 | 7/2012 | Nakashima et al. |
| 2012/0174961 A1 | 7/2012 | Larson et al. |
| 2012/0187769 A1 | 7/2012 | Spannhake et al. |
| 2012/0199172 A1 | 8/2012 | Avrutsky |
| 2012/0215367 A1 | 8/2012 | Eizips et al. |
| 2012/0217973 A1 | 8/2012 | Avrutsky |
| 2012/0240490 A1 | 9/2012 | Gangemi |
| 2012/0253533 A1 | 10/2012 | Eizips et al. |
| 2012/0253541 A1 | 10/2012 | Arditi et al. |
| 2012/0255591 A1 | 10/2012 | Arditi et al. |
| 2012/0274145 A1 | 11/2012 | Taddeo |
| 2012/0274264 A1 | 11/2012 | Mun et al. |
| 2012/0280571 A1 | 11/2012 | Hargis |
| 2013/0026839 A1 | 1/2013 | Grana |
| 2013/0026840 A1 | 1/2013 | Arditi et al. |
| 2013/0026842 A1 | 1/2013 | Arditi et al. |
| 2013/0026843 A1 | 1/2013 | Arditi et al. |
| 2013/0063119 A1 | 3/2013 | Lubomirsky |
| 2013/0094262 A1 | 4/2013 | Avrutsky |
| 2013/0134790 A1 | 5/2013 | Amaratunga et al. |
| 2013/0181533 A1 | 7/2013 | Capp et al. |
| 2013/0192657 A1 | 8/2013 | Hadar et al. |
| 2013/0222144 A1 | 8/2013 | Hadar et al. |
| 2013/0229834 A1 | 9/2013 | Garrity et al. |
| 2013/0229842 A1 | 9/2013 | Garrity |
| 2013/0234518 A1 | 9/2013 | Mumtaz et al. |
| 2013/0235637 A1 | 9/2013 | Rodriguez |
| 2013/0279210 A1 | 10/2013 | Chisenga et al. |
| 2013/0294126 A1 | 11/2013 | Garrity et al. |
| 2013/0307556 A1 | 11/2013 | Ledenev et al. |
| 2013/0332093 A1 | 12/2013 | Adest et al. |
| 2014/0191583 A1 | 7/2014 | Chisenga et al. |
| 2014/0246915 A1 | 9/2014 | Mumtaz |
| 2014/0246927 A1 | 9/2014 | Mumtaz |
| 2014/0252859 A1 | 9/2014 | Chisenga et al. |
| 2014/0265579 A1 | 9/2014 | Mumtaz |
| 2014/0306543 A1 | 10/2014 | Garrity et al. |
| 2014/0327313 A1 | 11/2014 | Arditi et al. |
| 2015/0022006 A1 | 1/2015 | Garrity et al. |
| 2015/0028683 A1 | 1/2015 | Hadar et al. |
| 2015/0028692 A1 | 1/2015 | Makhota et al. |

FOREIGN PATENT DOCUMENTS

| | | | |
|---|---|---|---|
| CA | 1183574 A1 | 3/1985 |
| CA | 2063243 A1 | 12/1991 |
| CA | 2301657 A1 | 3/1999 |
| CA | 2394761 A1 | 6/2001 |
| CA | 2658087 A1 | 6/2001 |
| CA | 2443450 A1 | 3/2005 |
| CA | 2572452 A1 | 1/2006 |
| CA | 2613038 A1 | 1/2007 |
| CA | 2704605 A1 | 5/2009 |
| CN | 2305016 Y | 1/1999 |
| CN | 1262552 A | 8/2000 |
| CN | 1064487 C | 4/2001 |
| CN | 1309451 A | 8/2001 |
| CN | 1362655 A | 8/2002 |
| CN | 2514538 Y | 10/2002 |
| CN | 1122905 C | 10/2003 |
| CN | 1185782 C | 1/2005 |
| CN | 2672938 Y | 1/2005 |
| CN | 1245795 C | 3/2006 |
| CN | 1787717 A | 6/2006 |
| CN | 1841254 A | 10/2006 |
| CN | 1841823 A | 10/2006 |
| CN | 1892239 A | 1/2007 |
| CN | 1902809 A | 1/2007 |
| CN | 1929276 A | 3/2007 |
| CN | 1930925 A | 3/2007 |
| CN | 101030752 A | 9/2007 |
| CN | 101050770 A | 10/2007 |
| CN | 100371843 C | 2/2008 |
| CN | 101136129 A | 3/2008 |
| CN | 100426175 C | 10/2008 |
| CN | 201203438 Y | 3/2009 |
| CN | 101488271 A | 7/2009 |
| CN | 101523230 A | 9/2009 |
| CN | 101672252 A | 3/2010 |
| CN | 101779291 A | 7/2010 |
| CN | 101847939 A | 9/2010 |
| CN | 201601477 U | 10/2010 |
| CN | 201623478 U | 11/2010 |
| CN | 101953060 A | 1/2011 |
| CN | 202103601 U | 1/2012 |
| CN | 102474112 A | 5/2012 |
| DE | 3236071 A1 | 1/1984 |
| DE | 3525630 A1 | 1/1987 |
| DE | 3729000 A1 | 3/1989 |
| DE | 4019710 A1 | 1/1992 |
| DE | 4032569 A1 | 4/1992 |
| DE | 4232356 A1 | 3/1994 |
| DE | 4325436 A1 | 2/1995 |
| DE | 4328511 A1 | 3/1995 |
| DE | 19515786 A1 | 11/1995 |
| DE | 19502762 A1 | 8/1996 |
| DE | 19609189 A1 | 9/1997 |
| DE | 19618882 A1 | 11/1997 |
| DE | 19701897 A1 | 7/1998 |
| DE | 19718046 A1 | 11/1998 |
| DE | 19732218 C1 | 3/1999 |
| DE | 19737286 A1 | 3/1999 |
| DE | 19838230 A1 | 2/2000 |
| DE | 19846818 A1 | 4/2000 |
| DE | 19904561 C1 | 8/2000 |
| DE | 19928809 A1 | 1/2001 |
| DE | 019937410 A1 | 2/2001 |
| DE | 19961705 A1 | 7/2001 |
| DE | 10064039 A1 | 12/2001 |
| DE | 10060108 A1 | 6/2002 |
| DE | 10103431 A1 | 8/2002 |
| DE | 10136147 A1 | 2/2003 |
| DE | 10222621 A1 | 11/2003 |
| DE | 202004001246 U1 | 4/2004 |
| DE | 10345302 A1 | 4/2005 |
| DE | 102004043478 A1 | 4/2005 |
| DE | 69734495 T2 | 7/2006 |
| DE | 69735169 T2 | 8/2006 |
| DE | 102005018173 A1 | 10/2006 |
| DE | 102005030907 A1 | 1/2007 |
| DE | 102005032864 A1 | 1/2007 |
| DE | 102006023563 A1 | 11/2007 |
| DE | 102006026073 A1 | 12/2007 |
| DE | 102007050031 B3 | 4/2009 |
| DE | 102008057874 A1 | 5/2010 |
| EP | 0027405 A1 | 4/1981 |
| EP | 169673 A1 | 1/1986 |
| EP | 0178757 A2 | 4/1986 |
| EP | 0206253 A1 | 12/1986 |
| EP | 0231211 A1 | 8/1987 |
| EP | 0293219 A2 | 11/1988 |
| EP | 0340006 A2 | 11/1989 |
| EP | 419093 A2 | 3/1991 |
| EP | 420295 A1 | 4/1991 |
| EP | 0521467 A2 | 1/1993 |
| EP | 0576271 A2 | 12/1993 |
| EP | 0577334 A2 | 1/1994 |
| EP | 604777 A1 | 7/1994 |
| EP | 0628901 A2 | 12/1994 |
| EP | 0642199 A1 | 3/1995 |

(56) References Cited

FOREIGN PATENT DOCUMENTS

| | | |
|---|---|---|
| EP | 0670915 A1 | 9/1995 |
| EP | 756178 A2 | 1/1997 |
| EP | 0756372 A1 | 1/1997 |
| EP | 0780750 A2 | 6/1997 |
| EP | 0809293 A1 | 11/1997 |
| EP | 827254 A2 | 3/1998 |
| EP | 0895146 A1 | 2/1999 |
| EP | 0906660 A1 | 4/1999 |
| EP | 0947905 A2 | 10/1999 |
| EP | 1012886 A1 | 6/2000 |
| EP | 1024575 A2 | 8/2000 |
| EP | 1034465 A1 | 9/2000 |
| EP | 1035640 A1 | 9/2000 |
| EP | 1039620 A2 | 9/2000 |
| EP | 1039621 A2 | 9/2000 |
| EP | 1047179 A1 | 10/2000 |
| EP | 1130770 A2 | 9/2001 |
| EP | 1143594 A2 | 10/2001 |
| EP | 1187291 A2 | 3/2002 |
| EP | 1235339 A2 | 8/2002 |
| EP | 1239573 A1 | 9/2002 |
| EP | 1239576 A2 | 9/2002 |
| EP | 1254505 A2 | 11/2002 |
| EP | 1271742 A2 | 1/2003 |
| EP | 1330009 A2 | 7/2003 |
| EP | 1339153 A2 | 8/2003 |
| EP | 1369983 A1 | 12/2003 |
| EP | 1376706 A2 | 1/2004 |
| EP | 1388774 A1 | 2/2004 |
| EP | 1400988 A2 | 3/2004 |
| EP | 1407534 A2 | 4/2004 |
| EP | 1418482 A1 | 5/2004 |
| EP | 1429393 A2 | 6/2004 |
| EP | 1442473 A2 | 8/2004 |
| EP | 1447561 A1 | 8/2004 |
| EP | 1457857 A2 | 9/2004 |
| EP | 1463188 A2 | 9/2004 |
| EP | 1475882 A2 | 11/2004 |
| EP | 1503490 A1 | 2/2005 |
| EP | 1521345 A1 | 4/2005 |
| EP | 1526633 A2 | 4/2005 |
| EP | 1531542 A2 | 5/2005 |
| EP | 1531545 A2 | 5/2005 |
| EP | 1532727 A2 | 5/2005 |
| EP | 1552563 A2 | 7/2005 |
| EP | 1562281 A1 | 8/2005 |
| EP | 1580862 A1 | 9/2005 |
| EP | 1603212 A2 | 12/2005 |
| EP | 1610571 A2 | 12/2005 |
| EP | 1623495 A1 | 2/2006 |
| EP | 1657557 A1 | 5/2006 |
| EP | 1657797 A1 | 5/2006 |
| EP | 1691246 A2 | 8/2006 |
| EP | 1706937 A1 | 10/2006 |
| EP | 1708070 A1 | 10/2006 |
| EP | 1716272 A1 | 11/2006 |
| EP | 1728413 A1 | 12/2006 |
| EP | 1750193 A1 | 2/2007 |
| EP | 1766490 A1 | 3/2007 |
| EP | 1782146 A2 | 5/2007 |
| EP | 1785800 A1 | 5/2007 |
| EP | 1842121 A2 | 10/2007 |
| EP | 1887675 A2 | 2/2008 |
| EP | 1901419 A2 | 3/2008 |
| EP | 1902349 A2 | 3/2008 |
| EP | 1911101 A1 | 4/2008 |
| EP | 2048679 A1 | 4/2009 |
| EP | 2061088 A2 | 5/2009 |
| EP | 2092625 A2 | 8/2009 |
| EP | 2092631 A2 | 8/2009 |
| EP | 2135348 A2 | 12/2009 |
| EP | 2144133 A1 | 1/2010 |
| EP | 2206159 A2 | 7/2010 |
| EP | 2232690 A1 | 9/2010 |
| EP | 2234237 A1 | 9/2010 |
| EP | 2315328 A2 | 4/2011 |
| EP | 2374190 A1 | 10/2011 |
| EP | 2393178 A2 | 12/2011 |
| EP | 2495766 A1 | 9/2012 |
| EP | 2533299 A1 | 12/2012 |
| EP | 2549635 A1 | 1/2013 |
| EP | 2561596 A2 | 2/2013 |
| EP | 2621045 A2 | 7/2013 |
| EP | 2666222 A1 | 11/2013 |
| EP | 2722979 A1 | 4/2014 |
| EP | 2779251 A1 | 9/2014 |
| ES | 2249147 A1 | 3/2006 |
| ES | 2249149 A1 | 3/2006 |
| FR | 2796216 A1 | 1/2001 |
| FR | 2819653 A1 | 7/2002 |
| GB | 1211885 A | 11/1970 |
| GB | 1261838 A | 1/1972 |
| GB | 1571681 A | 7/1980 |
| GB | 1597508 A | 9/1981 |
| GB | 2327208 A | 1/1999 |
| GB | 2339465 A | 1/2000 |
| GB | 2376801 A | 12/2002 |
| GB | 2399463 A | 9/2004 |
| GB | 2399465 A | 9/2004 |
| GB | 2415841 A | 1/2006 |
| GB | 2419968 A | 5/2006 |
| GB | 2421847 A | 7/2006 |
| GB | 2476508 A | 6/2011 |
| GB | 2480015 A | 11/2011 |
| GB | 2480015 B | 11/2011 |
| GB | 2482653 A | 2/2012 |
| GB | 2483317 A | 3/2012 |
| GB | 2485527 A | 5/2012 |
| GB | 2486408 A | 6/2012 |
| GB | 2487368 A | 7/2012 |
| GB | 2497275 A | 6/2013 |
| GB | 2498365 A | 7/2013 |
| GB | 2498790 A | 7/2013 |
| GB | 2498791 A | 7/2013 |
| GB | 2499991 A | 9/2013 |
| JP | 61065320 A | 4/1986 |
| JP | H01311874 A | 12/1989 |
| JP | H04219982 A | 8/1992 |
| JP | H04364378 A | 12/1992 |
| JP | 8009557 A | 1/1996 |
| JP | H0897460 A | 4/1996 |
| JP | H08116628 A | 5/1996 |
| JP | H08185235 A | 7/1996 |
| JP | H08227324 A | 9/1996 |
| JP | H08316517 A | 11/1996 |
| JP | H08317664 A | 11/1996 |
| JP | H094692 A | 1/1997 |
| JP | H09148611 A | 6/1997 |
| JP | H09275644 A | 10/1997 |
| JP | 2676789 B2 | 11/1997 |
| JP | H1017445 A | 1/1998 |
| JP | H1075580 A | 3/1998 |
| JP | H10201086 A | 7/1998 |
| JP | 11041832 A | 2/1999 |
| JP | H1146457 A | 2/1999 |
| JP | 11103538 A | 4/1999 |
| JP | 2892183 B2 | 5/1999 |
| JP | 11206038 A | 7/1999 |
| JP | H11266545 A | 9/1999 |
| JP | 11289891 A | 10/1999 |
| JP | 11318042 A | 11/1999 |
| JP | 2000020150 A | 1/2000 |
| JP | 3015512 B2 | 3/2000 |
| JP | 2000160789 A | 6/2000 |
| JP | 2000166097 A | 6/2000 |
| JP | 2000174307 A | 6/2000 |
| JP | 2000232791 A | 8/2000 |
| JP | 2000232793 A | 8/2000 |
| JP | 2000316282 A | 11/2000 |
| JP | 2000324852 A | 11/2000 |
| JP | 2000339044 A | 12/2000 |
| JP | 2000341974 A | 12/2000 |
| JP | 2000347753 A | 12/2000 |
| JP | 2000358330 A | 12/2000 |

(56) References Cited

FOREIGN PATENT DOCUMENTS

| | | |
|---|---|---|
| JP | 2001060120 A | 3/2001 |
| JP | 2001075662 A | 3/2001 |
| JP | 2001178145 A | 6/2001 |
| JP | 2001189476 A | 7/2001 |
| JP | 2001224142 A | 8/2001 |
| JP | 2001250964 A | 9/2001 |
| JP | 2002073184 A | 3/2002 |
| JP | 2002238246 A | 8/2002 |
| JP | 2002270876 A | 9/2002 |
| JP | 2002300735 A | 10/2002 |
| JP | 2002339591 A | 11/2002 |
| JP | 2002354677 A | 12/2002 |
| JP | 2003102134 A | 4/2003 |
| JP | 2003124492 A | 4/2003 |
| JP | 2003134661 A | 5/2003 |
| JP | 2003134667 A | 5/2003 |
| JP | 2003289674 A | 10/2003 |
| JP | 2004055603 A | 2/2004 |
| JP | 2004111754 A | 4/2004 |
| JP | 2004194500 A | 7/2004 |
| JP | 2004260944 A | 9/2004 |
| JP | 2004312994 A | 11/2004 |
| JP | 2004334704 A | 11/2004 |
| JP | 3656531 B2 | 6/2005 |
| JP | 2005192314 A | 7/2005 |
| JP | 2005251039 A | 9/2005 |
| JP | 2006041440 A | 2/2006 |
| JP | 2007058845 A | 3/2007 |
| JP | 2010-146047 A | 7/2010 |
| JP | 2010245532 A | 10/2010 |
| JP | 2012511299 A | 5/2012 |
| KR | 20010044490 A | 6/2001 |
| KR | 20040086088 A | 10/2004 |
| KR | 100468127 B1 | 1/2005 |
| KR | 200402282 Y1 | 11/2005 |
| KR | 100725755 B1 | 5/2007 |
| KR | 100912892 B1 | 8/2009 |
| NL | 1011483 C2 | 9/2000 |
| WO | 8202134 A1 | 6/1982 |
| WO | 8403402 A1 | 8/1984 |
| WO | 8804801 A1 | 6/1988 |
| WO | 9207418 A1 | 4/1992 |
| WO | 9313587 A1 | 7/1993 |
| WO | 9607130 A1 | 3/1996 |
| WO | 9613093 A1 | 5/1996 |
| WO | 9823021 A2 | 5/1998 |
| WO | 9928801 A1 | 6/1999 |
| WO | 00/00839 A1 | 1/2000 |
| WO | 00/21178 A1 | 4/2000 |
| WO | 0075947 A1 | 12/2000 |
| WO | 0077522 A1 | 12/2000 |
| WO | 0147095 A2 | 6/2001 |
| WO | 0231517 | 4/2002 |
| WO | 02056126 A1 | 7/2002 |
| WO | 02078164 A1 | 10/2002 |
| WO | 02093655 A1 | 11/2002 |
| WO | 03012569 | 2/2003 |
| WO | 03012569 A1 | 2/2003 |
| WO | 03050938 A2 | 6/2003 |
| WO | 03071655 A1 | 8/2003 |
| WO | 03084041 A1 | 10/2003 |
| WO | 04001942 A1 | 12/2003 |
| WO | 2004006342 A1 | 1/2004 |
| WO | 2004008619 A2 | 1/2004 |
| WO | 2004023278 A2 | 3/2004 |
| WO | 2004053993 A1 | 6/2004 |
| WO | 2004090993 A2 | 10/2004 |
| WO | 2004098261 A2 | 11/2004 |
| WO | 2004100344 A2 | 11/2004 |
| WO | 2004100348 A1 | 11/2004 |
| WO | 2004107543 A2 | 12/2004 |
| WO | 2005015584 A2 | 2/2005 |
| WO | 2005027300 A1 | 3/2005 |
| WO | 2005053189 A1 | 6/2005 |
| WO | 2005069096 A1 | 7/2005 |
| WO | 2005076444 A1 | 8/2005 |
| WO | 2005076445 A1 | 8/2005 |
| WO | 2005089030 A1 | 9/2005 |
| WO | 2005112551 A2 | 12/2005 |
| WO | 2005119609 A2 | 12/2005 |
| WO | 2005124498 A1 | 12/2005 |
| WO | 2006002380 A1 | 1/2006 |
| WO | 2006005125 A1 | 1/2006 |
| WO | 2006007198 A1 | 1/2006 |
| WO | 2006011071 A2 | 2/2006 |
| WO | 2006011359 A1 | 2/2006 |
| WO | 2006013600 A2 | 2/2006 |
| WO | 2006048688 A1 | 5/2006 |
| WO | 2006048689 A2 | 5/2006 |
| WO | 2006071436 A2 | 7/2006 |
| WO | 2006078685 A2 | 7/2006 |
| WO | 2006079503 A2 | 8/2006 |
| WO | 2006089778 A2 | 8/2006 |
| WO | 2006110613 A2 | 10/2006 |
| WO | 2007006564 A2 | 1/2007 |
| WO | 2007007360 A2 | 1/2007 |
| WO | 2007010326 A1 | 1/2007 |
| WO | 2007048421 A2 | 5/2007 |
| WO | 2007072517 A1 | 6/2007 |
| WO | 2007073951 A1 | 7/2007 |
| WO | 2007080429 A2 | 7/2007 |
| WO | 2007084196 A2 | 7/2007 |
| WO | 2007090476 A2 | 8/2007 |
| WO | 2007113358 A1 | 10/2007 |
| WO | 2007124518 A1 | 11/2007 |
| WO | 2008008528 A2 | 1/2008 |
| WO | 2008026207 A2 | 3/2008 |
| WO | 2008077473 A2 | 7/2008 |
| WO | 2008097591 A2 | 8/2008 |
| WO | 2008125915 A2 | 10/2008 |
| WO | 2008132551 A2 | 11/2008 |
| WO | 2008132553 A2 | 11/2008 |
| WO | 2008142480 A2 | 11/2008 |
| WO | 2009006879 A2 | 1/2009 |
| WO | 2009007782 A2 | 1/2009 |
| WO | 2009020917 A2 | 2/2009 |
| WO | 2009046533 A1 | 4/2009 |
| WO | 2009051221 A1 | 4/2009 |
| WO | 2009051222 A1 | 4/2009 |
| WO | 2009051853 A1 | 4/2009 |
| WO | 2009056957 A2 | 5/2009 |
| WO | 2009059028 A2 | 5/2009 |
| WO | 2009064683 A2 | 5/2009 |
| WO | 2009/072075 A2 | 6/2009 |
| WO | 2009/073867 A1 | 6/2009 |
| WO | 2009072077 A1 | 6/2009 |
| WO | 2009073995 A1 | 6/2009 |
| WO | 2009114341 A2 | 9/2009 |
| WO | 2009118682 A2 | 10/2009 |
| WO | 2009118683 A2 | 10/2009 |
| WO | 2009073868 A1 | 11/2009 |
| WO | 2009136358 A1 | 11/2009 |
| WO | 2009155392 A1 | 12/2009 |
| WO | 2010/002960 A1 | 1/2010 |
| WO | 2010/003941 A2 | 1/2010 |
| WO | 2010014116 A1 | 2/2010 |
| WO | 2010037393 A1 | 4/2010 |
| WO | 2010062662 A2 | 6/2010 |
| WO | 2010065043 A1 | 6/2010 |
| WO | 2010065388 A1 | 6/2010 |
| WO | 2010072717 A1 | 7/2010 |
| WO | 2010078303 A1 | 7/2010 |
| WO | 2010091025 A2 | 8/2010 |
| WO | 2010094012 A1 | 8/2010 |
| WO | 2010134057 A1 | 11/2010 |
| WO | 2011005339 A1 | 1/2011 |
| WO | 2011011711 A1 | 1/2011 |
| WO | 2011014275 A1 | 2/2011 |
| WO | 2011017721 A1 | 2/2011 |
| WO | 2011023732 A2 | 3/2011 |
| WO | 2011028456 A2 | 3/2011 |
| WO | 2011028457 A2 | 3/2011 |
| WO | 2011059067 A1 | 5/2011 |
| WO | 2011074025 A1 | 6/2011 |

(56) References Cited

FOREIGN PATENT DOCUMENTS

| WO | 2011085259 A2 | 7/2011 |
|---|---|---|
| WO | 2011119587 A2 | 9/2011 |
| WO | 2011133843 A2 | 10/2011 |
| WO | 2011133928 A2 | 10/2011 |
| WO | 2011151672 A1 | 12/2011 |
| WO | 2013015921 A1 | 1/2013 |
| WO | 9823021 A | 7/2013 |
| WO | 2013130563 A1 | 9/2013 |

OTHER PUBLICATIONS

International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Chen, et al., "A New Low-Stress Buck-Boost Converter for Universal-Input PFC Applications", IEEE Applied Power Electronics Conference, Feb. 2001, Colorado Power Electronics Center Publications.
Chen, et al., "Buck-Boost PWM Converters Having Two Independently Controlled Switches", IEEE Power Electronics Specialists Conference, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "Photovoltaic DC-DC Module Integrated Converter for Novel Cascaded and Bypass Grid Connection Topologies—Design and Optimisation", 37th IEEE Power Electronics Specialists Conference, Jun. 18-22, 2006, Jeju, Korea.
Geoffrey R. Walker Affidavit re: U.S. Appl. No. 11/950,307, submitted in an IDS for U.S. Appl. No. 11/950,271 on Mar. 9, 2010.
Geoffrey R. Walker Affidavit re: U.S. Appl. No. 11/950,271, submitted in an IDS for U.S. Appl. No. 11/950,271 on Mar. 9, 2010.
International Search Report for PCT/IB2007/004610 dated Feb. 23, 2009.
International Search Report for PCT/IB2007/004584 dated Jan. 28, 2009.
International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.
Knaupp, et al., "Operation of a 10 KW PV Façade with 100 W AC Photovoltaic Modules", 1996 IEEE, 25th PVSC, May 13-17, 1996, pp. 1235-1238, Washington, DC.
Alonso, et al., "Cascaded H-Bridge Multilevel Converter for Grid Connected Photovoltaic Generators with Independent Maximum Power Point Tracking of Each Solar Array", 2003 IEEE 34th, Annual Power Electronics Specialists Conference, Acapulco, Mexico, Jun. 15-19, 2003, pp. 731-735, vol. 2.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.
Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.
Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769-773.
Lindgren, "Topology for Decentralised Solar Energy Inverters with a Low Voltage AC-Bus", Chalmers University of Technology, Department of Electrical Power Engineering, EPE '99—Lausanne.
Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.
Palma, "A Modular Fuel Cell, Modular DC-DC Converter Concept for High Performance and Enhanced Reliability", IEEE 2007, pp. 2633-2638.
Quaschning, "Cost Effectiveness of Shadow Tolerant Photovoltaic Systems", Berlin University of Technology, Institute of Electrical Energy Technology, Renewable Energy Section, EuroSun '96, pp. 819-824.
Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, Jun. 6-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Walker, "Cascaded DC-DC Converter Connection of Photovoltaic Modules", IEEE Transactions on Power Electronics, vol. 19, No. 4, Jul. 2004, pp. 1130-1139.
Matsui, et al., "A New Maximum Photovoltaic Power Tracking Control Scheme Based on Power Equilibrium at DC Link", IEEE, 1999, pp. 804-809.
Hou, et al., Application of Adaptive Algorithm of Solar Cell Battery Charger, Apr. 2004.
Stamenic, et al., "Maximum Power Point Tracking for Building Integrated Photovoltaic Ventilation Systems", 2000.
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18(3), Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
Sandia Report SAND96-2797 I UC-1290 Unlimited Release, Printed Dec. 1996, "Photovoltaic Power Systems and the National

(56) References Cited

OTHER PUBLICATIONS

Electrical Code: Suggested Practices", by John Wiles, Southwest Technology Development Institute New Mexico State University Las Cruces, NM.
United Kingdom Intellectual Property Office, Combined Search and Examination Report Under Sections 17 and 18(3), GB1020862.7, dated Jun. 16, 2011.
International Application No. PCT/US13/27965, International Preliminary Examination Report, Sep. 2, 2014.
International Patent Application PCT/US13/027965, International Search Report and Written Opinion, Jun. 2, 2013.
International Application No. PCT/US12/44045, International Preliminary Examination Report, Jan. 28, 2014.
International Patent Application No. PCT/US2012/044045, International Search Report and Written Opinion, Jan. 2, 2013.
International Patent Application No. PCT/US2009/047734, International Search Report and Written Opinion, May 4, 2010.
Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.
International Patent Application No. PCT/US2010/029929, International Search Report and Written Opinion, Oct. 27, 2010.
International Patent Application No. PCT/US2011/020591, International Search Report and Written Opinion, Aug. 8, 2011.
International Patent Application No. PCT/US2011/033544, International Search Report and Written Opinion, Nov. 24, 2011.
J. Keller and B. Kroposki, titled, "Understanding Fault Characteristics of Inverter-Based Distributed Energy Resources", in a Technical Report NREL/TP-550-46698, published Jan. 2010, pp. 1 through 48.
International Patent Application No. PCT/US2008/081827, International Search Report and Written Opinion, Jun. 24, 2009.
International Patent Application No. PCT/US2010/046274 International Search Report and Written Opinion, Apr. 22, 2011.
International Patent Application No. PCT/US2011/033658, International Search Report and Written Opinion, Jan. 13, 2012.
International Patent Application No. PCT/US2011/029392, International Search Report and Written Opinion, Oct. 24, 2011.
European Patent Application No. 09829487.9, Extended Search Report, Apr. 21, 2011.
International Patent Application No. PCT/US2009/062536, International Search Report and Written Opinion, Jun. 17, 2010.
International Patent Application No. PCT/US2010/022915, International Search Report and Written Opinion, Aug. 23, 2010.
International Patent Application No. PCT/US2010/046272, International Search Report and Written Opinion, Mar. 31, 2011.
International Patent Application No. PCT/US2010/029936, International Search Report and Written Opinion, Nov. 12, 2010.
International Patent Application No. PCT/US08/75127, International Search Report and Written Opinion, Apr. 28, 2009.
International Patent Application No. PCT/US09/35890, International Search Report and Written Opinion, Oct. 1, 2009.
European Patent Appilcation No. 08845104.2, Extended Search Report, Jul. 31, 2014.
European Patent Application No. 11772811.3, Extended Search Report, Dec. 15, 2014.
International Patent Application No. PCT/US2008/082935, International Search Report and Written Opinion, Jun. 25, 2009.
Rodriguez, C., and G. A. J. Amaratunga. "Dynamic stability of grid-connected photovoltaic systems." Power Engineering Society General Meeting, 2004. IEEE, pp. 2194-2200.
Kikuchi, Naoto, et al. "Single phase amplitude modulation inverter for utility interaction photovoltaic system." Industrial Electronics Society, 1999. IECON'99 Proceedings. The 25th Annual Conference of the IEEE. vol. 1. IEEE, 1999.
Nonaka, Sakutaro, et al. "Interconnection system with single phase IGBT PWM CSI between photovoltaic arrays and the utility line." Industry Applications Society Annual Meeting, 1990., Conference Record of the 1990 IEEE.

Calais, Martina, et al. "Inverters for single-phase grid connected photovoltaic systems—an overview." Power Electronics Specialists Conference, 2002. pesc 02. 2002 IEEE 33rd Annual. vol. 4. IEEE, 2002.
Marra, Enes Goncalves, and José Antenor Pomilio. "Self-excited induction generator controlled by a VS-PWM bidirectional converter for rural applications." Industry Applications, IEEE Transactions on 35.4 (1999): 877-883.
Xiaofeng Sun, Weiyang Wu, Xin Li, Qinglin Zhao: A Research on Photovoltaic Energy Controlling System with Maximum Power Point Tracking:; Proceedings of the Power Conversion Conference—Osaka 2002 (Cat. No. 02TH8579) IEEE—Piscataway, NJ, USA, ISBN 0-7803-7156-9, vol. 2, p. 822-826, XP010590259: the whole document.
International Search Report for corresponding PCT/GB2005/050198 completed Jun. 28, 2006 by C. Wirner of the EPO.
Brunello, Gustavo, et al., "Shunt Capacitor Bank Fundamentals and Protection," 2003 Conference for Protective Relay Engineers, Apr. 8-10, 2003, pp. 1-17, Texas A&M University, College Station, TX, USA.
Cordonnier, Charles-Edouard, et al., "Application Considerations for Sensefet Power Devices," PCI Proceedings, May 11, 1987, pp. 47-65.
Kotsopoulos, Andrew, et al., "Predictive DC Voltage Control of Single-Phase PV Inverters with Small DC Link Capacitance," IEEE International Symposium, Month Unknown, 2003, pp. 793-797.
Meinhardt, Mike, et al., "Multi-String-Converter with Reduced Specific Costs and Enhanced Functionality," Solar Energy, May 21, 2001, pp. 217-227, vol. 69, Elsevier Science Ltd.
Kimball, et al.: "Analysis and Design of Switched Capacitor Converters"; Grainger Center for Electric Machinery and Electromechanics, University of Illinois at Urbana-Champaign, 1406 W. Green St, Urbana, IL 61801 USA, © 2005 IEEE; pp. 1473-1477.
Martins, et al.: "Interconnection of a Photovoltaic Panels Array to a Single-Phase Utility Line From a Static Conversion System"; Power Electronics Specialists Conference, 2000. PESC 00. 2000 IEEE 31st Annual; Jun. 18, 2000-Jun. 23, 2000; ISSN: 0275-9306; pp. 1207-1211, vol. 3.
International Search Report for corresponding PCT/GB2005/050197, completed Dec. 20, 2005 by K-R Zettler of the EPO.
Kjaer, Soeren Baekhoej, et al., "Design Optimization of a Single Phase Inverter for Photovoltaic Applications," IEEE 34th Annual Power Electronics Specialist Conference, Jun. 15-19, 2003, pp. 1183-1190, vol. 3, IEEE.
Shimizu, Toshihisa, et al., "A Flyback-type Single Phase Utility Interactive Inverter with Low-frequency Ripple Current Reduction on the DC Input for an AC Photovoltaic Module System," IEEE 33rd Annual Power Electronics Specialist Conference, Month Unknown, 2002, pp. 1483-1488, vol. 3, IEEE.
Written Opinion of PCT/GB2005/050197, Feb. 14, 2006 (mailing date), Enecsys Limited.
Yatsuki, Satoshi, et al., "A Novel AC Photovoltaic Module System based on the Impedance-Admittance Conversion Theory," IEEE 32nd Annual Power Electronics Specialists Conference, Month Unknown, 2001, pp. 2191-2196, vol. 4, IEEE.
International Search Report for corresponding PCT/GB2004/001965, completed Aug. 16, 2004 by A. Roider.
Naik et al., A Novel Grid Interface for Photovoltaic, Wind-Electric, and Fuel-Cell Systems With a Controllable Power Factor or Operation, IEEE, 1995, pp. 995-998.
Petkanchin, Processes following changes of phase angle between current and voltage in electric circuits, Aug. 1999, Power Engineering Review, IEEE vol. 19, Issue 8, pp. 59-60.
Mumtaz, Asim, et al., "Grid Connected PV Inverter Using a Commercially Available Power IC," PV in Europe Conference, Oct. 2002, 3 pages, Rome, Italy.
Koutroulis, Eftichios, et al., "Development of a Microcontroller-Based, Photovoltaic Maximum Power Point Tracking Control System," IEEE Transactions on Power Electronics, Jan. 2001, pp. 46-54, vol. 16, No. 1, IEEE.
European Search Report—EP App. 14159457.2—mailed Jun. 12, 2015.

(56) References Cited

OTHER PUBLICATIONS

European Search Report and Written Opinion—EP Appl. 12150819.6—dated Jul. 6, 2015.
Alonso, O. et al. "Cascaded H-Bridge Multilevel Converter for Grid Connected Photovoltaic Generators With Independent Maximum Power Point Tracking of Each Solar Array." IEEE 34th Annual Power Electronics Specialists Conference. vol. 2, Jun. 15, 2003.
QT Technical Application Papers, "ABB Circuit-Breakers for Direct current Applications", ABB SACE S.p.A., An ABB Group Company, L.V. Breakers, Via Baioni, 35, 24123 Bergamo—Italy, Tel.: +39 035.395.111—Telefax: +39 035.395.306-433, Sep. 2007.
Woyte, et al., "Mains Monitoring and Protection in a European Context", 17th European Photovoltaic Solar Energy Conference and Exhibition, Munich, Germany,Oct. 22-26, 2001, Achim, Woyte, et al., pp. 1-4.
"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.
Fairchild Semiconductor, Application Note 9016, IGBT Basics 1, by K.S. Oh Feb. 1, 2001.
"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.
Walker, "A DC Circuit Breaker for an Electric Vehicle Battery Pack", Australasian Universities Power Engineering Conference and IEAust Electric Energy Conference, Sep. 26-29, 1999.
Combined Search and Examination Report for GB1018872.0 dated Apr. 15, 2011, 2 pages.
International Search Report and Opinion of International Patent Application PCT/2009/051221, dated Oct. 19, 2009.
International Search Report and Opinion of International Patent Application PCT/2009/051222, dated Oct. 7, 2009.
Communication in EP07874025.5 dated Aug. 17, 2011.
IPRP for PCT/IB2008/055095 dated Jun. 8, 2010, with Written Opinion.
ISR for PCT/IB2008/055095 dated Apr. 30, 2009.
ISR for PCT/IL07/01064 dated Mar. 25, 2008.
IPRP for PCT/IB2007/004584 dated Jun. 10, 2009, with Written Opinion.
IPRP for PCT/IB2007/004591 dated Jul. 13, 2010, with Written Opinion.
IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report 18(3), Sep. 16, 2011.
UK Intellectual Property Office, Patents Act 1977: Patents Rules Notification of Grant: Patent Serial No. GB2480015, Nov. 29, 2011.
Walker, et al. "PV String Per-Module Maximum Power Point Enabling Converters", School of Information Technology and Electrical Engineering The University of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. Cairns, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.
IPRP for PCT/IL2007/001064 dated Mar. 17, 2009, with Written Opinion dated Mar. 25, 2008.
IPRP for PCT/IB2007/004586 dated Jun. 10, 2009, with Written Opinion.
Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
IPRP PCT/IB2007/004610—date of issue Jun. 10, 2009.
Extended European Search Report—EP12176089.6—Mailing date: Nov. 8, 2012.
Gwon-Jong Yu et al: "Maximum power point tracking with temperature compensation of photovoltaic for air conditioning system with fuzzy controller", May 13, 1996; May 13, 1996-May 17, 1996, May 13, 1996 (May 13, 1996), pp. 1429-1432, XP010208423.
Extended European Search Report—EP12177067.1—Mailing Date: Dec. 7, 2012.
GB Combined Search and Examination Report—GB1200423.0—Mailing date: Apr. 30, 2012.
GB Combined Search and Examination Report—GB1201499.9—Mailing date: May 28, 2012.
GB Combined Search and Examination Report—GB1201506.1—Mailing date: May 22, 2012.
"Study of Energy Storage Capacitor Reduction for Single Phase PWM Rectifier", Ruxi Wang et al., Virginia Polytechnic Institute and State University, Feb. 2009.
"Multilevel Inverters: A Survey of Topologies, Controls, and Applications", José Rodríguez et al., IEEE Transactions on Industrial Electronics, vol. 49, No. 4, Aug. 2002.
Extended European Search Report—EP 08878650.4—Mailing date: Mar. 28, 2013.
Satcon Solstice—Satcon Solstice 100 kW System Solution Sheet—2010.
John Xue, "PV Module Series String Balancing Converters", University of Queensland—School of Information Technology & Electrical Engineering, Nov. 6, 2002.
Robert W. Erickson, "Future of Power Electronics for Photovoltaics", IEEE Applied Power Electronics Conference, Feb. 2009.
GB Combined Search and Examination Report—GB1203763.6—Mailing date: Jun. 25, 2012.
Mohammad Reza Amini et al., "Quasi Resonant DC Link Inverter with a Simple Auxiliary Circuit", Journal of Power Electronics, vol. 11, No. 1, Jan. 2011.

(56) References Cited

OTHER PUBLICATIONS

Khairy Fathy et al., "A Novel Quasi-Resonant Snubber-Assisted ZCS-PWM DC-DC Converter with High Frequency Link", Journal of Power Electronics, vol. 7, No. 2, Apr. 2007.
Cheng K.W.E., "New Generation of Switched Capacitor Converters", Department of Electrical Engineering, The Hong Kong Polytechnic University, Hung Hom, Hong Kong, Power Electronics Conference, 1998, PESC 98.
Per Karlsson, "Quasi Resonant DC Link Converters—Analysis and Design for a Battery Charger Application", Universitetstryckeriet, Lund University, 1999, ISBN 91-88934-14-4.
Hsiao Sung-Hsin et al., "ZCS Switched-Capacitor Bidirectional Converters with Secondary Output Power Amplifier for Biomedical Applications", Power Electronics Conference (IPEC) Jun. 21, 2010.
Yuang-Shung Lee et al.,"A Novel QR ZCS Switched-Capacitor Bidirectional Converter", IEEE, 2007.
Antti Tolvanen et al., "Seminar on Solar Simulation Standards and Measurement Principles", May 9, 2006 Hawaii.
J.A. Eikelboom and M.J. Jansen, "Characterisation of PV Modules of New Generations—Results of tests and simulations", Jun. 2000.
Yeong-Chau Kuo et al., "Novel Maximum-Power-Point-Tracking Controller for Photovoltaic Energy Conversion System", IEEE Transactions on Industrial Electronics, vol. 48, No. 3, Jun. 2001.
C. Liu et al., "Advanced Algorithm for MPPT Control of Photovoltaic Systems", Canadian Solar Buildings Conference, Montreal, Aug. 20-24, 2004.
Chihchiang Hua and Chihming Shen, "Study of Maximum Power Tracking Techniques and Control of DC/DC Converters for Photovoltaic Power System", IEEE 1998.
Tore Skjellnes et al., "Load sharing for parallel inverters without communication", Nordic Workshop in Power and Industrial Electronics, Aug. 12-14, 2002.
Giorgio Spiazzi at el., "A New Family of Zero-Current-Switching Variable Frequency dc-dc Converters", IEEE 2000.
Nayar, C.V., M. Ashari and W.W.L Keerthiphala, "A Gridinteractive Photovoltaic Uninterruptible Power Supply System Using Battery Storage and a Back up Diesel Generator", IEEE Transactions on Energy Conversion, vol. 15, No. 3, Sep. 2000, pp. 348-353.
Ph. Strauss et al., "AC coupled PV Hybrid systems and Micro Grids-state of the art and future trends", 3rd World Conference on Photovoltaic Energy Conversion, Osaka, Japan May 11-18, 2003.
Nayar, C.V., abstract, Power Engineering Society Summer Meeting, 2000. IEEE, 2000, pp. 1280-1282 vol. 2.
D. C. Martins et al., "Analysis of Utility Interactive Photovoltaic Generation System using a Single Power Static Inverter", Asian J. Energy Environ., vol. 5, Issue 2, (2004), pp. 115-137.
Rafael C. Beltrame et al., "Decentralized Multi String PV System With Integrated ZVT Cell", Congresso Brasileiro de Automática / Sep. 12-16, 2010, Bonito-MS.
Sergio Busquets-Monge et al., "Multilevel Diode-clamped Converter for Photovoltaic Generators With Independent Voltage Control of Each Solar Array", IEEE Transactions on Industrial Electronics, vol. 55, No. 7, Jul. 2008.
Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—Mailing date: Mar. 26, 2013.
Supplementary European Search Report—EP08857456—Mailing Date Dec. 6, 2013.
Extended European Search Report—EP14151651.8—Mailing date: Feb. 25, 2014.
Iyomori H et al: "Three-phase bridge power block module type auxiliary resonant AC link snubber-assisted soft switching inverter for distributed AC power supply", Intelec 2003. 25th. International Telecommunications Energy Conference. Yokohama, Japan, Oct. 19-23, 2003; Tokyo, IEICE, JP, Oct. 23, 2003 (Oct. 23, 2003), pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998 (Dec. 17, 1998), XP055055241, Blacksburg, Virginia Retrieved from the Internet: URL:http:jjscholar.lib.vt.edu/theses/available/etd-012299-165108/unrestricted/THESIS.PDF, [retrieved on Mar. 5, 2013].
Yoshida M et al: "Actual efficiency and electromagnetic noises evaluations of a single inductor resonant AC link snubber-assisted three-phase soft-switching inverter", Intelec 2003. 25th. International Telecommunications Energy Conference. Yokohama, Japan, Oct. 19-23, 2003; Tokyo, IEICE, JP, Oct. 23, 2003 (Oct. 23, 2003), pp. 721-726, XP031895560, ISBN: 978-4-88552-196-6.
Third party observation—EP07874025.5—Mailing date: Aug. 6, 2011.
Extended European Search Report—EP 13152967.9—Mailing date: Aug. 28, 2014.
Extended European Search Report—EP 14159696—Mailing Date: Jun. 20, 2014.
Gow Ja A et al: "A Modular DC-DC Converter and Maximum Power Tracking Controller Formedium to Large Scale Photovoltaic Generating Plant" $8^{th}$ European Conference on Power Electronics and Applications. Lausaane, CH, Sep. 7-9, 1999, EPE. European Conference on Power Electronics and Applications, Brussls: EPE Association, BE, vol. Conf. 8, Sep. 7, 1999, pp. 1-8, XP000883026.
Chihchiang Hua et al: "Comparative Study of Peak Power Tracking Techniques for Solar Storage System" Applied Power Electronics Conference and Exposition, 1998. APEC '98. Conference Proceedings 1998, Thirteenth Annual Anaheim, CA USA Feb. 15-19, 1998, New York, NY, USA, IEEE, US, Feb. 15, 1998, pp. 679-685, XP010263666.
Matsuo H et al: "Novel Solar Cell Power Supply System Using the Miltiple-input DC-DC Converter" $20^{th}$ International telecommunications Energy Conference. Intelec '98 San Francisco, CA, Oct. 4-8, 1998, Intelec International Telecommunications Energy Conference, New York, NY: IEEE, US, Oct. 4, 1998, pp. 797-802, XP000896384.
Chihchiang Hua et al: "DSP-based controller application in battery storage of photovoltaic system" Industrial Electronics, Control, and Instrumentation, 1996, Proceedings of the 1996 IEEE IECON $22^{nd}$ International Conference on Taipei, Taiwan Aug. 5-10, 1996, New York, NY, USA, IEEE, US, Aug. 5, 1996, pp. 1705-1710, XP010203239.
Hua C et al: "Implementation of a DSP-Controlled Photovoltaic System with Peak Power Tracking" IEEE Transactions on industrial Electronics, IEEE, Inc. New York, US, vol. 45, No. 1, Feb. 1, 1998, pp. 99-107, XP000735209.
I. Weiss et al.: "A new PV system technology—the development of a magnetic power transmission from the PV module to the power bus" 16th European Photovoltaic Solar Energy Conference, vol. III, May 1-5, 2000, pp. 2096-2099, XP002193468 Glasgow,UK.
Basso, Tim, "IEEE Standard for Interconnecting Distributed Resources With the Electric Power System," IEEE PES Meeting, Jun. 9, 2004.
Boostbuck.com, "The Four Boostbuck Topologies," located at http://www.boostbuck.com/TheFourTopologies.html, 2003.
Gautam, Nalin K. et al., "An Efficient Algorithm to Simulate the Electrical Performance of Solar Photovoltaic Arrays," Energy, vol. 27, No. 4, pp. 347-361, 2002.
Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.
Wiles, John, "Photovoltaic Power Systems and the National Electrical Code: Suggested Practices," Sandia National Laboratories, document No. SAND2001-0674, Mar. 2001.
Hewes, J. "Relays," located at http://web.archive.org/web/20030816010159/www.kpsec.freeuk.com/components/relay.htm, Aug. 16, 2003.
Advanced Energy Group, "The Basics of Solar Power Systems," located at http://web.archive.org/web/20010331044156/http://www.solar4power.com/solar-power-basics.html, Mar. 31, 2001.
International Patent Application No. PCT/AU2005/001017, International Search Report and Written Opinion, Aug. 18, 2005.
Baek, Ju-Won et al., "High Boost Converter using Voltage Multiplier," 2005 IEEE Conference, IECON 05, pp. 567-572, Nov. 2005.

(56) References Cited

OTHER PUBLICATIONS

Wikimedia Foundation, Inc., "Electric Power Transmission," located at http://web.archive.org/web/20041210095723/en.wikipedia.org/wiki/Electric-power-transmission, Nov. 17, 2004.
Jacobsen, K.S., "Synchronized Discrete Multi-Tone (SDMT) Modulation for Cable Modems: Making the Most of the Scarce Reverse Channel Bandwidth," Conference Proceedings of Wescon/97, pp. 374-380, Nov. 4, 1997.
Loyola, L. et al., "A Multi-Channel Infrastructure based on DCF Access Mechanism for Wireless LAN Mesh Networks Compliant with IEEE 802.11," 2005 Asia-Pacific Conference on Communications, pp. 497-501, Oct. 5, 2005.
Storfer, Lior, "Enhancing Cable Modem TCP Performance," Texas Instruments Inc. white paper, Jul. 2003.
International Preliminary Report on Patentability Issued in corresponding international application No. PCT/US04/16868, filed May 27, 2004.

* cited by examiner

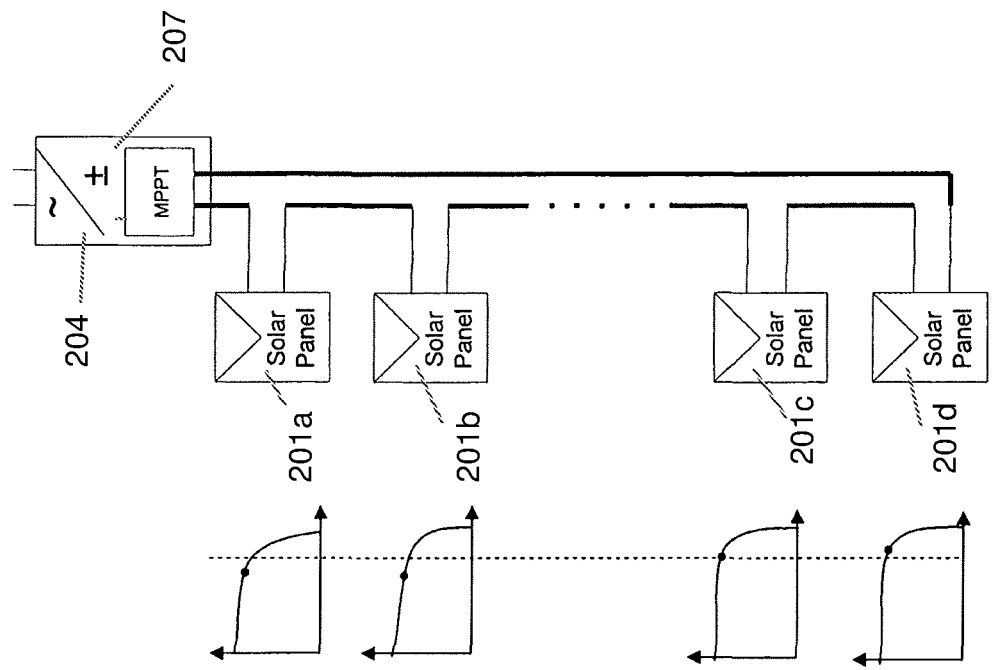
*Figure 2 – Prior Art*
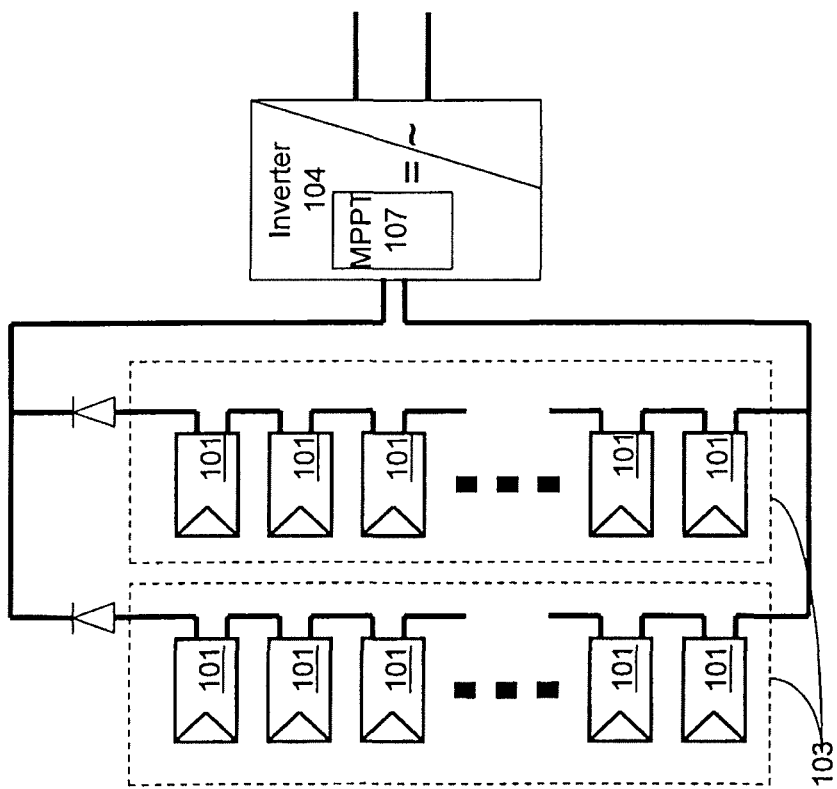
*Figure 1 – Prior Art*

MONITORING OF DISTRIBUTED POWER HARVESTING SYSTEMS USING DC POWER SOURCES

CROSS-REFERENCE TO RELATED APPLICATIONS

This application a continuation of U.S. patent application Ser. No. 13/901,890 filed May 24, 2013, titled "Monitoring of Distributed Power Harvesting Systems Using DC Power Sources," which is a continuation of U.S. patent application Ser. No. 11/951,419 filed Dec. 6, 2007, titled "Monitoring of Distributed Power Harvesting Systems Using DC Power Sources", which claims priority to U.S. Provisional Patent Applications, Ser. No. 60/868,851, filed Dec. 6, 2006, and titled "Distributed Solar Array Monitoring, Management and Maintenance," Ser. No. 60/868,893, filed Dec. 6, 2006, and titled "Distributed Power Harvesting System for Distributed Power Sources," 60/868,962, filed Dec. 7, 2006, and titled "System, Method and Apparatus for Chemically Independent Battery," Ser. No. 60/908,095, filed Mar. 26, 2007, and titled "System and Method for Power Harvesting from Distributed Power Sources," and Ser. No. 60/916,815, filed May 9, 2007, and titled "Harvesting Power from Direct Current Power Sources." The entire contents of the above-identified applications are incorporated herein by reference. Further, this application is related to ordinary U.S. patent application Ser. No. 11/950,224, filed Dec. 4, 2007, titled "Current Bypass for Distributed Power Harvesting Systems Using DC Power Sources," patent application Ser. No. 11/950,271, filed Dec. 4, 2007, titled "Distributed Power Harvesting Systems Using DC Power Sources," patent application Ser. No. 11/950,307, filed Dec. 4, 2007, titled "A Method for Distributed Power Harvesting Using DC Power Sources," "Removable Component Cartridge for Increasing Reliability in Power Harvesting Systems," and "Battery Power Delivery Module," that are filed in at the U.S. Patent and Trademark Office on Dec. 6, 2007 and incorporates the entire content of these applications by this reference.

BACKGROUND

1. Field of the Invention

The field of the invention generally relates to management of distributed DC power sources and, more particularly, to monitoring of distributed DC power sources, such as solar cell array, fuel cells, batteries, and similar applications.

2. Related Arts

The recent increased interest in renewable energy has led to increased research in systems for distributed generation of energy, such as photovoltaic cells (PV), fuel cells, batteries (e.g., for hybrid cars), etc. Various topologies have been proposed for connecting these power sources to the load, taking into consideration various parameters, such as voltage/current requirements, operating conditions, reliability, safety, costs, etc. For example, most of these sources provide low voltage output (normally lower than 3V), so that many of them need to be connected serially to achieve the required operating voltage. Conversely, a serial connection may fail to provide the required current, so that several strings of serial connections may need to be connected in parallel to provide the required current.

It is also known that power generation from each of these sources depends on manufacturing, operating, and environmental conditions. For example, various inconsistencies in manufacturing may cause two identical sources to provide different output characteristics. Similarly, two identical sources may react differently to operating and/or environmental conditions, such as load, temperature, etc. In practical installations, different source may also experience different environmental conditions, e.g., in solar power installations some panels may be exposed to full sun, while others be shaded, thereby delivering different power output. While these problems and the solutions provided by the subject invention are applicable to any distributed power system, the following discussion turns to solar energy so as to provide better understanding by way of a concrete example.

A conventional installation of solar power system 10 is illustrated in FIG. 1. Since the voltage provided by each individual solar panel 101 is low, several panels are connected in series to form a string of panels 103. For a large installation, when higher current is required, several strings 103 may be connected in parallel to form the overall system 10. The solar panels are mounted outdoors, and their leads are connected to a maximum power point tracking (MPPT) module 107 and then to an inverter box 104. The MPPT 107 is typically implemented as part of the inverter 104.

The harvested power from the DC sources is delivered to the inverter 104, which converts the fluctuating direct-current (DC) into alternating-current (AC) having a desired voltage and frequency, which, for residential application, is usually 110V or 220V at 60 Hz or 220V at 50 Hz. The AC current from the inverter 104 may then be used for operating electric appliances or fed to the power grid. Alternatively, if the installation is not tied to the grid, the power extracted from the inverter may be directed to a conversion and charge/discharge circuit to store the excess power created as charge in batteries. In case of a battery-tied application, the inversion stage might be skipped altogether, and the DC output of the MPPT stage 107 may be fed into the charge/discharge circuit.

FIG. 2 illustrates one serial string of DC sources, e.g., solar panels 201a-201d, connected to MPPT circuit 207 and inverter 204. The current versus voltage (IV) characteristics are plotted (210a-210d) to the left of each DC source 201. For each DC source 201, the current decreases as the output voltage increases. At some voltage value the current goes to zero, and in some applications may assume a negative value, meaning that the source becomes a sink. Bypass diodes are used to prevent the source from becoming a sink. The power output of each source 201, which is equal to the product of current and voltage (P=I*V), varies depending on the voltage drawn from the source. At a certain current and voltage, the power reaches its maximum. It is desirable to operate a power generating cell at this maximum power point. The purpose of the MPPT is to find this point and operate the system at this point so as to draw the maximum power from the sources.

Various environmental and operational conditions impact the power output of DC power sources. For example, the solar energy incident on various panels, ambient temperature and other factors impact the power extracted from each panel. Depending on the number and type of panels used, the extracted power may vary widely in the voltage and current. Changes in temperature, solar irradiance and shading, either from near objects such as trees or far objects such as clouds, can cause power losses. Owners and even professional installers find it difficult to verify the correct operation of the system. With time, many more factors, such as aging, dust and dirt collection and module degradation affect the performance of the solar array.

Data collected at the inverter 104 is not sufficient to provide proper monitoring of the operation of the system.

Moreover, when the system experiences power loss, it is desirable to ascertain whether it is due to environmental conditions or from malfunctions and/or poor maintenance of the components of the solar array. Furthermore, it is desirable to easily locate the particular solar panel that may be responsible for the power loss. However, to collect information from each panel requires some means of communication to a central data gathering system. The data gathering system needs to be able to control data transmission, avoid transmission collisions, and ascertain each sender of data. Such a requirement can be most easily accomplished using a duplex transmission method. However, a duplex transmission method requires additional transmission lines and complicates the system. On the other hand, one-way transmission is prone to collisions and makes it difficult to compare data transmitted from the various sources.

Consequently, conventional methods in the field of solar array monitoring focus mainly on the collection of the output parameters from the overall solar array. Due to the wide variability of power output of such systems, and the wide range of environmental conditions that affect the power output, the output parameters from the overall system are not sufficient to verify whether the solar array is operating at peak power production. Local disturbances, such as faulty installation, improper maintenance, reliability issues and obstructions might cause locals power losses which are difficult to detect from overall monitoring parameters.

For further discussion of the above issues relating to distributed power sources and solar panels, the reader is highly encouraged to review the following literature, which may or may not be prior art.

Cascade DC-DC Converter Connection of Photovoltaic Modules, G. R. Walker and P. C. Sernia, *Power Electronics Specialists Conference,* 2002. (*PESCO*2), Vol. 1 IEEE, Cairns, Australia, pp. 24-29.

Topology for Decentralized Solar Energy Inverters with a Low Voltage AC-Bus, Bjorn Lindgren.

Integrated Photovoltaic Maximum Power Point Tracking Converter, Johan H. R. Enslin et al., IEEE Transactions on Industrial Electronics, Vol. 44, No. 6, December 1997.

A New Distributed Converter Interface for PV Panels, R. Alonso et al., 20th European Photovoltaic Solar Energy Conference, 6-10 Jun. 2005, Barcelona, Spain.

Intelligent PV Module for Grid-Connected PV Systems, Eduardo Roman, et al., IEEE Transactions on Industrial Electronics, Vol. 53, No. 4, August 2006. Also in Spanish patent application ES2249147.

A Modular Fuel Cell, Modular DC-DC Converter Concept for High Performance and Enhanced Reliability, L. Palma and P. Enjeti, Power Electronics Specialists Conference, 2007, PESC 2007, IEEE Volume, Issue, 17-21 Jun. 2007 Page(s): 2633-2638. Digital Object Identifier 10.1109/PESC.2007.4342432.

Experimental Results of intelligent PV Module for Grid-Connected PV Systems, R. Alonso et al., Twenty first European Photovoltaic Solar Energy Conference, Proceedings of the International Conference held in Dresden, Germany, 4-8 Sep. 2006.

Cascaded DC-DC Converter Connection of Photovoltaic Modules, G. R. Walker and P. C. Semia, IEEE Transactions on Power Electronics, Vol. 19, No. 4, July 2004.

Cost Effectiveness of Shadow Tolerant Photovoltaic Systems, Quaschning, V.; Piske, R.; Hanitsch, R., Euronsun 96, Freiburg, Sep. 16-19, 1996.

Evaluation Test results of a New Distributed MPPT Converter, R. Orduz and M. A. Egido, 22nd European Photovoltaic Solar Energy Conference, 3-7 Sep. 2007, Milan, Italy.

Energy Integrated Management System for PV Applications, S. Uriarte et al., 20th European Photovoltaic Solar Energy Conference, 6-10 Jun. 2005, Barcelona, Spain.

U.S. Published Application 2006/0185727

SUMMARY

The following summary of the invention is provided in order to provide a basic understanding of some aspects and features of the invention. This summary is not an extensive overview of the invention, and as such it is not intended to particularly identify key or critical elements of the invention, or to delineate the scope of the invention. Its sole purpose is to present some concepts of the invention in a simplified form as a prelude to the more detailed description that is presented below.

According to aspects of the invention, there is provided a monitoring system employing one-way transmission. Collisions are avoided or minimized by a novel transmission timing scheme. The novel transmission method also voids the necessity to synchronize the transmission of data. According to aspects of the invention, each transmission carries a unique ID of the data source. The data is collected and stored at a central analysis system, and various analysis is performed on the data to ascertain the operation parameters of each transmission source and of the entire system. According to further aspects of the invention, a mechanism for sending an interrupt message is provided. When a fault is detected in any of the power sources, an interrupt message may be sent that overrides all other messages, so that the fault may be detected immediately. According to aspects of the invention, all data transmission is done using power line communication (PLC). Alternatively, other modes of transmission may be used, such as wireless or dedicated transmission lines, such as Ethernet, RS232, RE485, etc.

According to aspects of the invention, a monitoring system for distributed DC power installation is provided, comprising: a plurality of power sources; a plurality of monitoring modules, each monitoring module associated with one of the power sources and collecting performance data of the associated power source; a plurality of transmitters, each transmitter associated with one of the monitoring modules and transmitting the performance data; a plurality of controllers, each associated with one of the transmitters and controlling transmission events according to elapsed time from timer initialization. Each of the power sources may be connected to a power line and wherein each transmitter transmits the performance data over the power line. Each of the monitoring modules comprises: a current measurement module for collecting the current data; and a voltage measurement module for collecting the voltage data. Each of the monitoring modules may further comprise a temperature sensor module for sensing the temperature data at the power source. Each of the monitoring modules may further comprise an arc detection module for detecting arcing at the power source. Each of the monitoring modules may further comprise a timer, and wherein each controller initializes the timer whenever the associated power source starts to generate power. Each of the monitoring modules may further comprise a randomizer for varying time increments for controlling transmission events. The monitoring system may further comprise a memory storing the performance data accumulated since timer initialization. The monitoring system may further comprise: a central analysis station; and, a communication translator for receiving the performance data from the monitoring modules and transmitting the performance data to the central analysis station. The central analysis station may analyze fault detection. The central analysis station may compare measured power to expected power determined based on external data. Each of the power sources may comprise a solar panel. Each of the power sources may comprise a string of serially connected solar panels. Each of the monitoring modules may comprise a current measurement module for collecting current data. The monitoring system may further comprise: a connection box for parallel coupling all of the string of serially connected solar panels; and, a voltage measuring module measuring the voltage of the parallel coupling. The monitoring system may further comprise: a connection box for parallel coupling all of the string of serially connected solar panels; and, total current measuring module measuring the total current of the parallel coupling. The monitoring system may detect current leakage by comparing output of the total current measuring module to the sum of current measuring modules of each of the monitoring modules.

According to aspects of the invention, a method for monitoring distributed power harvesting systems including DC power sources is provided, the method comprising: individually monitoring power generation at each of the DC power sources and, when power generation passes a threshold at one of the DC power sources, performing the steps: initializing a timer for the power source; collecting performance data for the power source; monitoring passage of time period of the timer and, when the time period reached a setup time, transmitting the collected performance data to a central analysis station. Collecting performance data may further comprise storing the performance data in memory, and wherein transmitting the collected performance data comprises transmitting the collected performance data accumulated since initialization of the timer. Collecting performance data may comprise measuring at least one of output voltage and output current. The method may further comprise comparing performance data for at least one of the DC power sources to performance data from the same DC power source at a different time. The method may further comprise comparing performance data for at least one of the DC power sources to performance data from adjacent ones of the DC power sources. The method may further comprise comparing performance data for at least one of the DC power sources to expected performance data based on external parameters. Monitoring passage of time period may further comprise introducing randomness to the setup time. The method may further comprise serially connecting a plurality of solar panels to form each of the DC power sources. Transmitting the collected performance data may comprise sending the collected performance data over a power line.

According to aspects of the invention, a distributed DC power harvesting system is provided, comprising: a plurality of solar panels serially connected to form a string of panels coupled to a power line; at least one monitoring module connected to the string of panels and gathering performance data from at least one solar panel, the monitoring module comprising: a transmitter for transmitting the performance data over the power line; a controller for controlling transmission events of the transmitter according to elapsed time from timer initialization; and, a receiving station coupled to the power line and receiving the performance data from the transmitter. The receiving station may further comprise at least one of a voltage and current sensor. The receiving station may further comprise a transmitter for relaying at least the performance data received from the power line. The transmitter may comprise a wireless transmitter. The monitoring module may comprise and least one of: a current measurement module for collecting current data from at least one solar panel; and a voltage measurement module for collecting voltage data from at least one solar panel. The monitoring module may further comprise a temperature sensor. The monitoring module may further comprise a timer, and wherein the controller initializes the timer whenever an associated panel starts to generate power. The monitoring module may further comprise a randomizer for varying time increments for controlling transmission events. The system may further comprise a memory storing the performance data accumulated since timer initialization. The system may further comprise: one or more additional string of panels; a connection box for parallel coupling of the string of panels and the one or more additional string of panels; and, a voltage measuring module measuring the voltage of the parallel coupling.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 illustrates a conventional solar power system.

FIG. 2 illustrates one serial string of DC sources and current versus voltage characteristic curve for the solar panels.

DETAILED DESCRIPTION

Aspects of the present invention provide a monitoring system for solar panel system. The monitoring system includes modules that may be attached to each solar panel of the solar system. The monitoring module will monitor several parameters including, etc., panel voltage, panel current, panel temperature, lighting conditions, spatial orientation (e.g., tilt), and other parameters. The information from each monitoring module may be transmitted to a central management unit together with a unique module ID. The transmission may be done over the powerlines, in wireless form, or with dedicated wiring—such as Ethernet, RS-232, RS-485 or other. In one aspect of the invention, transmission is done as power line communication in a one-way implementation. Collisions are avoided or minimized by using a unique transmission timing mechanism.

The central management unit may analyze the data from all solar panels. The monitoring system can be implemented at the string level, at the panel level or even at the cell level. The principle applicable at the panel level monitoring may be applied for string level and cell level. Moreover, the innovative monitoring system may be used in small installation, such as residential solar panel installations, and large installations, such as large solar panel field power plants.

Analysis of the data may enable detection and pinpointing of most of the common failures associated with solar array power loss. Further, smart analysis of current and historical data can also be used to suggest corrective measures such as cleaning or replacing a specific portion of the solar array. The system can also detect normal power losses caused by environmental conditions and prevent costly and difficult solar array testing. Additionally, analysis of the data can lead to suggestion for environmental corrective actions. For example, it may suggest changing the tilt or location of specific panels, or removing of obstacles that block the sun under certain conditions not realized at the time of installation.

Figures 3A, 3B:
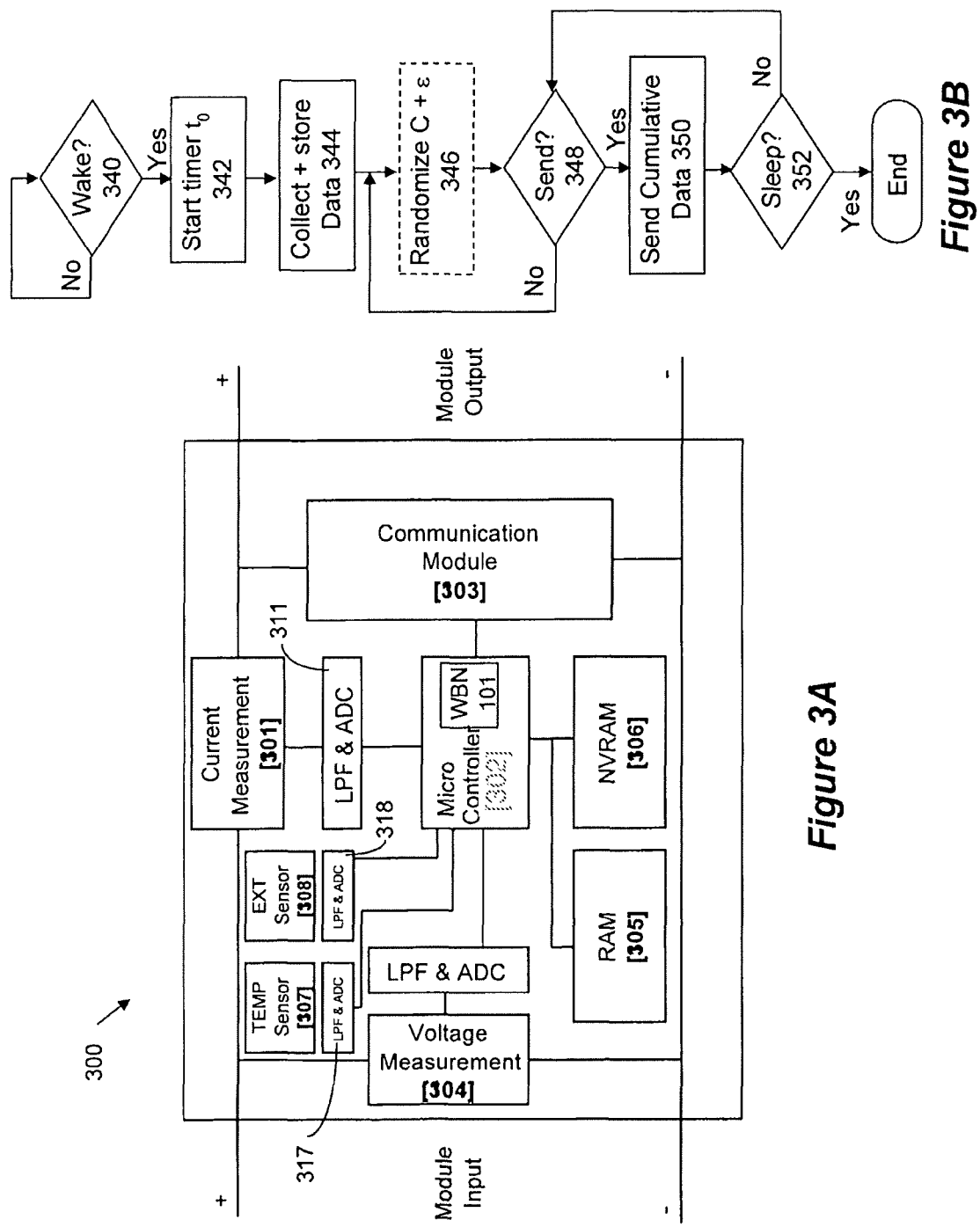
FIG. 3A illustrates a monitoring module according to aspects of the invention.
FIG. 3B is a flow chart illustrating a method for transmission of data according to various aspects.

FIG. 3A shows a monitoring module according to aspects of the invention. The exemplary monitoring module 300, according to aspect of the invention, is used to collect and transmit date from each solar panel, such as the solar panel 101 of FIG. 1. Data from all monitoring modules is transmitted via a communication system to a central analysis station, which analyzes the data and displays the status of the solar array.

The monitoring module 300 includes several sub-modules. The sub-modules within the monitoring module 300 include a current measurement module 301, a microcontroller 302, a communication module 303, a voltage measurement module 304, a random access memory (RAM) module, a non-volatile RAM or NVRAM module 306, a temperature sensor 307 and one or more external sensor interfaces 308.

The microcontroller module 302 is coupled to the other modules and controls the other modules. In one exemplary aspect shown in FIG. 3A, the current measurement module 301 is located in series with the input and output ports to the monitoring module 300. The location of the current measurement module 301 may vary depending on the type of current measurement device used in the module. In the exemplary aspect shown, the voltage measurement module 304 is located in parallel across the input port to the monitoring module 300. Voltage measurement devices are usually placed in parallel with the component whose voltage is being measured. In the exemplary aspect shown, the communication module 303 is shown as located in parallel with the output ports of the monitoring module 300. There is no requirement for a particular location for this module and the location shown is arbitrary. The sensor modules while coupled to the microcontroller module 302, are not shown as coupled to the input or output ports of the monitoring module 300. These sensor modules, however, may derive power from the panel connected to the monitoring module 300 and, therefore, may be located along a circuit path from the input to the output ports of the monitoring module 300. A power unit may be used to feed monitoring module 300. The power may be derived from one of many power sources, such as batteries or feed-in from another location. In one embodiment the monitoring module 300 may be fed from power harvested from the solar panel being monitored.

In various aspects of the invention, inclusion of some of the modules, such as the temperature sensor 307, is optional.

The monitoring module 300 can be implemented using discrete components or may be integrated to obtain an application specific integrated circuit (ASIC).

The measurement modules 301, 304 and the sensor modules 307, 308 may have filter circuits and analog to digital conversion circuits associated with them. FIG. 3A shows low-pass filter and analog to digital conversion circuits 311, 314, 317, 318 each associated with a corresponding measurement and sensor module.

Current and voltage measurement modules 301, 304 are used to collect current and voltage data. The collected data is transferred to the microcontroller module 302. The microcontroller module 302 may be a digital state machine. The microcontroller stores the collected information in its local RAM 305. Pre-defined data, stored in the NVRAM module 306, may be used to control the activity of the microcontroller 302.

The data collected by the current and voltage measurement modules 301, 304 and transferred to the microcontroller 302 may be subsequently transmitted to a central analysis station described below with respect to FIG. 4. The communication module 303 is used to transmit the data from the microcontroller 302 or from storage in RAM 305 to outside of the monitoring module 300.

The current measurement module 301 may be implemented by various techniques used to measure current. In one aspect of the invention, the current measurement module 301 is implemented using a very low value resistor. The voltage across the resistor will be proportional to the current flowing through the resistor. In another aspect of the invention, the current measurement module 301 is implemented using current probes which use the Hall Effect to measure the current through a conductor without the need to add a series resistor. After translating the current to voltage, the data passes through a low pass filter and is digitized. The low-pass filter and the analog to digital converter associated with the current measurement module 301 are shown as module 311 in FIG. 3A. As with the voltage measurement module, care must be taken to choose the correct resolution and sample rate for the analog to digital converter. If the current sensing technique does not require a series connection, then the monitoring module 300 may be connected to the panel in parallel. For a parallel connection, there is no need to disconnect the panel during the connection.

In one aspect of the invention, the voltage measurement module 304 uses simple parallel voltage measurement techniques in order to measure the voltage output of the solar panel. The analog voltage is passed through a low pass filter in order to minimize aliasing. The data is then digitized using an analog to digital converter. The low-pass filter and the analog to digital converter associated with the voltage measurement module 304 are shown as module 314 in FIG. 3A. The analog to digital converter 314 has sufficient resolution to correctly evaluate the voltage from the solar panel. The low-pass filter makes it possible for low sample rates to be sufficient for evaluating the state of the panel.

The optional temperature measurement module 307 enables the system to use temperature data in the analysis process. The temperature may be indicative of several types of failures and problems. Furthermore, the panel temperature is a factor in the power output from the panel and in the overall power production.

The one or more external sensor interfaces 308 enable connecting various external sensors to the monitoring module 300. These sensors are optional and may be used where they enable enhanced analysis of the state of the solar array. Examples of external sensors that may be used at the external sensor interfaces 308, include ambient temperature sensor, solar irradiance sensors, spatial orientation such as tilt sensor, sensors from neighboring panels and the like. When a type of sensor is regularly used, then it may be integrated into the monitoring module 300 instead of being an external component.

The microcontroller module 302 manages the monitoring process. The tasks performed by the microcontroller module 302 includes gathering information from the current and voltage measurement modules 301, 304, storing the information in local memory 305, 306 and transmitting the stored information to outside of the monitoring module 300. The microcontroller module 302 uses the information stored in memory in order to control its operation. This operating information may be stored in the non-volatile memory of the NVRAM module 306, to preserve the information even when power-loss occurs. Information in the NVRAM module 306 may include information about the microcontroller module 302 such as the serial number, the type of communication bus used, the status update rate and the ID of the central analysis station to which the data is transmitted. This information may be added to the parameters collected by the measurement modules 301, 304 before transmission out of the monitoring module 300.

Figure 5:
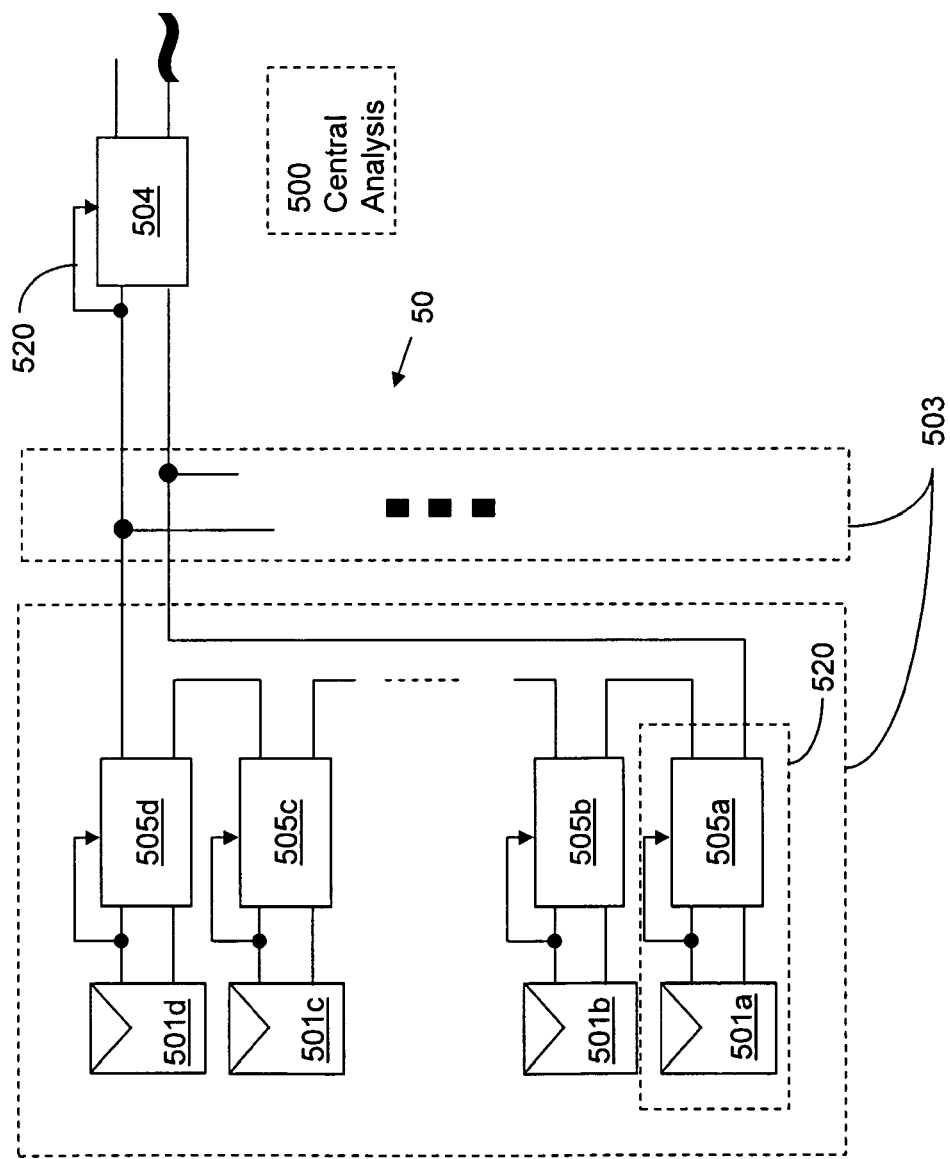
FIG. 5 shows a distributed power harvesting system, including a monitoring module, according to aspects of the invention.

The installation process of the monitoring module 300 includes connecting each of the monitoring modules 300 to a panel such as the solar panel 101 of FIG. 1 or the solar panel 505 of FIG. 5. The measurement features of the monitoring module 300 may be used to ensure that the panel and the monitoring module are properly connected and to record the serial number of the monitoring module 300 or the microcontroller within the monitoring module. The measurement features 301, 304, or other sensors, such as GPS, tilt etc., may also be used to determined physical location of the connection and the array connection topology. These parameters may be used by an analysis software at the central analysis station 403 to detect problems in the solar panels and the array.

The monitoring module 300 may be installed during the installation of the solar array or retrofitted to an existing installation. In both cases the monitoring module may be connected to the panel junction connection box or to the cables between the panels. The monitoring module may be provided with the connectors and cabling needed to enable easy installation and connection to the panels and cables.

The monitoring module 300 shown in FIG. 3A collects current, voltage and some other optional types of data from each of the panels in a distributed DC power harvesting system. Data from each panel is subsequently transmitted for analysis. The communication module 303 connects the microcontroller module 302 to the communication bus that is described below with reference in FIG. 4. The communication from each monitoring module 300 is performed using conventional power line communication technique (also known as power line carrier). However, a unique transmission timing is utilized in order to avoid or minimize collisions. This technique will be explained with reference to a specific example of a monitor connected to a solar panel.

When the solar panel "wakes", i.e., starts to receive sun light and generate output power, the monitor initializes a timer to time to. The monitor may or may not send data at the initialization time. Then, the monitor collects data continuously, but transmits collected data only after a given period has past from $t_0$ or from the last transmission. For example, the monitor may transmit data every 15 minutes. Since the panels are spatially separated, they will most likely wake at different times, introducing randomness to the transmission time, so that each panel would transmit according to its own timer. That is, each monitor would transmit data at:

$$t_0 + xC,$$

where x is a whole natural number and C is a set constant, say 15 minutes. However, for each panel $t_0$ may be at a different time every morning As can be appreciated from the above, using the wake up time of the panel to initiate the timer introduces a measure of randomness that helps avoid collisions. According to another embodiment of the invention, another measure of randomness is introduced in the counter. For example, the transmission time may be calculated as $t_0+xC+E$, where E is a random number provided by a random number generator, etc. Alternatively, the transmission time may be calculated as $t0+x(C+E)$. Notably, the random number should be generated separately to each module to prevent the chance that two panels wake at the same time and increment the counter at the same rate, thereby colliding on each transmission attempt. This random element may be reintroduced for each time a transmission is sent. Other methods of introducing randomness may also be used.

FIG. 3B is a flow chart illustrating a method for transmission of data by the monitor 300 of FIG. 3A. At step 340 it is checked whether the panel has awaken (i.e., receives light and generates power at a predetermined level). If so, the process proceeds to step 342 where the timer is initialized and the counting is started. Data, such as current, voltage, temperature, illumination, power output, etc., is then collected and stored, e.g., in RAM 305, at step 344, which continues so long as the timer progresses and the panel has not gone to sleep (352). As explained above, optionally a further randomization is introduced, which is shown by step 346. Then at step 348 it is determined whether the time for transmitting data has been reached and, if so, the data is transmitted at step 350. In this particular example, the data that is transmitted is the data accumulated since initialization of the timer. However, other methodologies may be implemented. For example, the data may be data accumulated since last transmission or current data reading. At step 352 it is checked whether the panel assumed the sleep mode, e.g., illumination or power generation is below a threshold. If so, the process ends. Otherwise, counting and transmission of data continues.

The above schemes minimize or avoid collisions. However, if a collision does occur, since the transmission is only one way, the central system would not get the data and would not know what data was lost, and the sending monitors would also have no way of knowing that the data never reached the central system. As a result, when the central system analyzes the data and compares data from one panel to another, errors may be introduced if some data transmission was lost due to collision. For example, if the central unit tries to compare power generated by several panels between 1 pm and 2 pm, the comparison would be inaccurate if data from two or more panels collided at 1:30 pm and is missing from the calculation.

To avoid this problem, a scheme is adopted wherein the data is accumulated at each monitor. Then, at each transmission, the accumulated total value of the data is transmitted. For example, at time $t_{15}$ the power generated from wake to wake plus 15 minutes is transmitted. At time ho the power generated from wake to wake plus 30 minutes is transmitted, and so on. In this way, even if one or more transmission was not received by the central unit, the central unit can reconstruct the missing data by, for example, extrapolating it from the data from all of the transmissions that were received. Similar extrapolation may be done in order to put data that arrived at different times from different panels in order to compare between panels on a unified time-base. E.g. Curves of power production from the monitors could be extrapolated for each panel based on the data points that arrived, and then these curves could be compared in order to detect power anomalies or other problems and phenomena.

According to a further aspect of the invention, an interrupt message may be sent, which overrules all other messages. An interrupt message may be sent by any monitoring module 300, for example, whenever a rapid corrective action may be required. This may be when power drops suddenly, as due to malfunction, panel breakage due to hail storms or other cause, etc. The interrupt message may be sent at any time, regardless of the counter's position. In connection with the interrupt message, according to an aspect of the invention a wide band noise detector is implemented in the module 300. When the wideband noise detector detects noise above a certain threshold, it sends an interrupt message. Notably, this feature is implemented to identify arcing that may be caused due to an open connection in the system. That is, since the system voltage is relatively high, e.g., 400-600V, if a connection becomes separated, and potential may arc through the air. Such arcing can be detected as wideband noise. The wideband noise detector may be implemented as part of the controller 102, as shown in FIG. 3A, or as a separate unit.

Additionally, to assist in locating faults and deleterious conditions, each monitor has a unique ID, which is transmitted together with the data. In this way, the central unit can easily monitor each panel individually and the physical location of the panel corresponding to each data stream can be easily ascertained. Thus, for example, if every day at 2 pm there is power drop at one or more panels, their physical location can be easily ascertained by using the unique ID transmitted with the data. Then the status of the panels can be evaluated to see whether there is an obstacle that obscures the sun every day at 2 pm. Furthermore, if a geographic information sensor (such as a GPS) is attached to the monitoring module, it could directly transmit its location so the obstruction may be found and removed.

The central analysis unit may also use the ID information to perform data analysis by comparing the data from the particular panel to expected data obtained from external sources. That is, if the central analysis system knows the location, temperature, tilt, etc., of the panel having the particular ID, it may calculate expected power from this panel at the current prevailing conditions. If the data received from the panel substantially deviates from the expected power output, it may determine that the panel is faulty or some factors cause it to lose power. This is especially a beneficial feature in the topology of the embodiment described herein, since the maximum power point tracking is performed on an individual panel basis, so the power obtained should be commensurable with the expected power. That is, there is no error introduced due to tracking maximum power point on an average of several panels.

Figure 4:
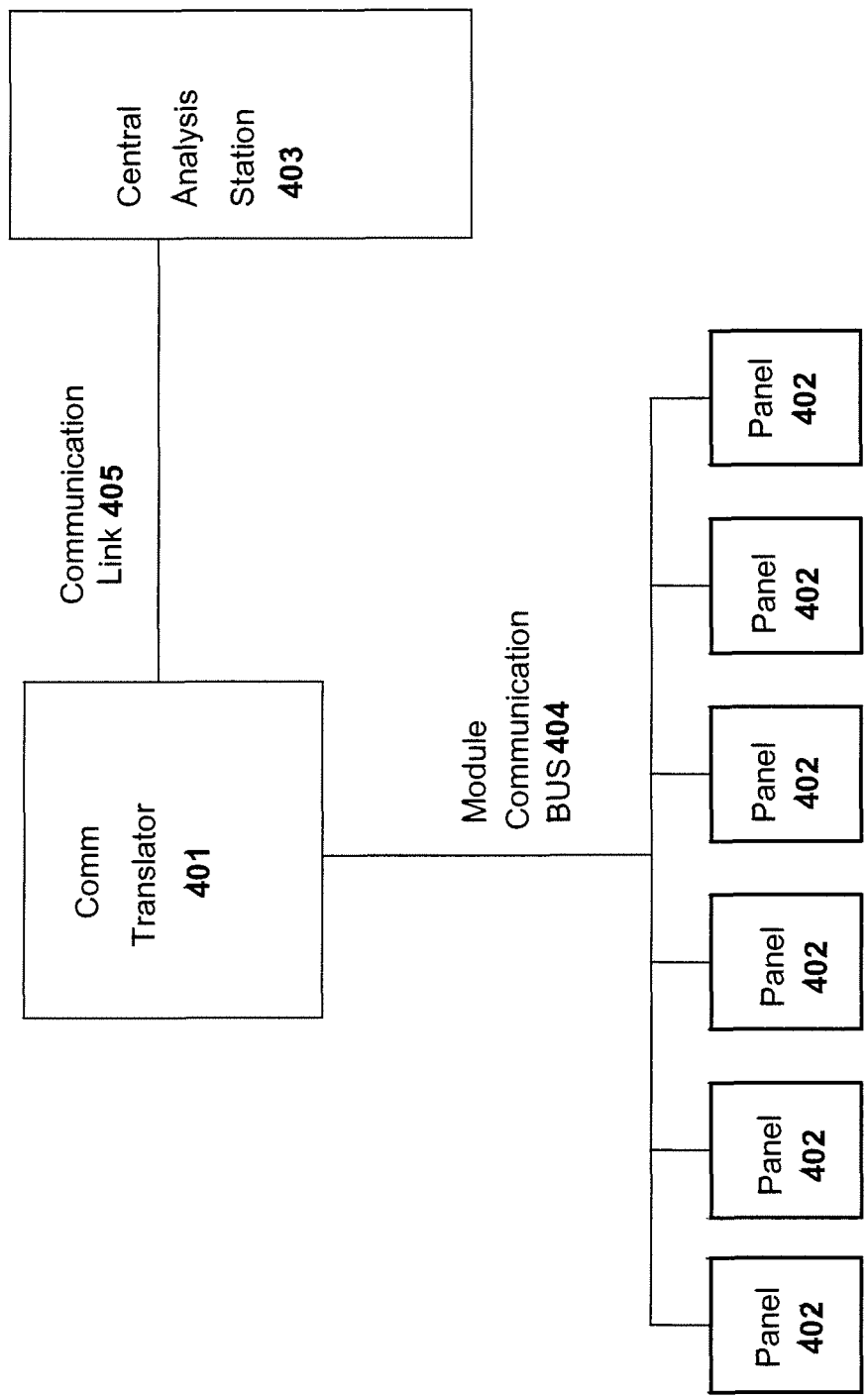
FIG. 4 shows a communication and analysis system, according to aspects of the invention, being associated with the monitoring module of FIG. 3A.

FIG. 4 shows a communication and analysis system, according to aspects of the invention, being associated with the monitoring module of FIG. 3A. FIG. 4 shows a system used for collecting data from each of the panels in a distributed power system and subsequent analysis of collected data. The system of FIG. 4 includes a number of panels 401 that generate power. Each panel includes a monitoring module such as the monitoring module 300. Data collected by the monitoring modules at the panels 402 are communicated by a module communication bus 404 to a communication translator 401. The communication translator 401 sends the date to a central analysis station 403 via a communication link 403. The central analysis station 403 receives the data that is transmitted via the communication bus 404, analyzes the data and displays the status of the panels corresponding to the time the data was collected.

In FIG. 4, one module communication bus 404 is shown for transmitting data from the monitoring modules 300 from a number of panels 402. The data may be transmitted on a single bus in the manner described above which eliminates or minimizes collisions. However, other transmission methods may be used. For example, the data from several panels may be multiplexed on the same module communication bus. Alternatively, each monitoring module 300 includes a separate module communication bus 404. The module communication buses 404 from the different monitoring modules carry the data from each monitoring module 300 to the communication translator 401.

The module communication bus 404 can be implemented in different ways. In one aspect of the invention, an off-the-shelf communication bus such as Ethernet, RS232 or RS485 is used. Using an off-the-shelf communication bus simplifies the design of the communication module 303 of the monitoring module 300 but requires separate cables. Other methods such as wireless communications or power line communications may also be used. When wired communication is used between the monitoring modules 300 and the communication translator 401, the communication translator 401 may be located in close physical proximity to the panels to reduce the length of the module communication bus 404 or buses. When wireless communication is used between the monitoring modules 300 and the communication translator 401, the communication translator 401 need not be in close physical proximity to the panels.

The communication translator 401 is used to convert the module communication bus or buses 404 to a standard communication protocol and physical layer. This enables receiving data from the monitoring module 300 on various data terminals, such as a computer or PDA. The central analysis station 403 may then be implemented as a software that is run on a standard PC, an embedded platform or a proprietary device.

In one aspect of the invention, unidirectional power line communication is used from the monitoring modules 300 to the central analysis station 403. With unidirectional communication, a mechanism for preventing cross-talk between the monitoring modules 300 may be provided. Such a mechanism may be implemented in the form of transmitting data from each of the monitoring modules 300 at preset times as explained with respect to FIG. 3B. In one aspect of the invention, a collision detection algorithm may be used to ensure the data is received without collisions at the central analysis station 403.

In one aspect of the invention, bidirectional communication is used between the central analysis station 403 and the monitoring modules 300. With bidirectional communication, the central analysis station 403 may proactively request the data collected by one or more of the monitoring modules 300.

The collected data is analyzed at the central analysis station 403. By analyzing the information from each of the monitoring modules, many causes for power losses can be detected. For example, when energy production from a panel is low on some hours of the day while the adjacent panels produce the same power on all hours, the low performance panel is probably shaded during the low production hours. Panels that produce little power in comparison to their adjacent panels might be constantly shaded, soiled or installed incorrectly. Comparison of the power output of each panel with its corresponding power output a year earlier may indicate that the output has diminished due to dust or soil collected on the panel. Additional data may be gathered from outside sources in order to monitor and evaluate the power production of the array. E.g. irradiance data from satellites, weather data from terrestrial stations, RADAR systems or satellites, or weather and irradiance forecasts based on historical data or computerized models, and so forth. Many more heuristics and algorithmic methods may be used to detect problems and help the owner of the system to pinpoint problems in the array. Having the unique ID transmitted with the data helps identify the panels and their physical location.

FIG. 5 shows a distributed power harvesting system, including a monitoring module, according to aspects of the invention. Configuration 50 enables connection of multiple power sources, for example solar panels 501 to a single power supply. The series connection of all of the solar panels is connected to an inverter 504. A central analysis station 500 is shown that is in communication with the monitoring modules 300 coupled to each of the solar panels 501. Station 500 may be incorporated into the inverter 504 or may be an independent unit.

In configuration 50, each solar panel 501 is connected to a separate power converter circuit 505. Power converter circuit 505 adapts optimally to the power characteristics of the connected solar pane 1501 and transfers the power efficiently from input to output. Power converters 505 can be buck converters, boost converters, buck/boost converters, flyback or forward converters. The converters 505 may also contain a number of component converters, for example a serial connection of a buck and a boost converter.

Each converter 505 includes a control loop that receives a feedback signal, not from the output current or voltage, but rather from the input coming from the solar panel 501. An example of such a control loop is a maximum power point tracking (MPPT) loop in solar array applications. The MPPT loop in the converter locks the input voltage and current from each solar panel 501 to its optimal power point. The MPPT loop of the converter 505 operates to perform maximum power point tracking and transfers the input power to its output without imposing a controlled output voltage or output current.

Each converter 505 may include a monitoring module according to the aspects of the invention. For example, each converter 505 may include the monitoring module 300 of FIG. 3A. The communication link between the monitoring modules 300 and the central analysis station 500 may be wireless or wired. If wired, the connection may be done to each unit 505 individually or centrally via inverter 504. Note that there is additional value in monitoring the panels output when coupling it with MPPT tracking power converter 505, since this guaranties that the power monitored is at maximum power point, and therefore low power reading signify a real problem and are not merely a false-alarm that results from the current draw from a central inverter, which may not be optimal for each panel. Converters 505 can be connected in series or in parallel to form strings and arrays.

Conventional DC-to-DC converters have a wide input voltage range at the solar panel side and an output voltage predetermined and fixed on installation. In these conventional DC-to-DC voltage converters, the controller monitors the current or voltage at the input, and the voltage at the output. The controller determines the appropriate pulse width modulation (PWM) duty cycle to fix the input voltage to the predetermined value decreasing the duty cycle if the input voltage drops while varying the current extracted from the input. In converters 505, according to embodiments of the present invention, the controller monitors the voltage and current at its input and determines the PWM in such a way that maximum power is extracted, dynamically tracking the maximum point. In embodiments of the present invention, the feedback loop is closed on the input power in order to track maximum power rather than closing the feedback loop on the output voltage as performed by conventional DC-to-DC voltage converters.

The outputs of converters 505 are series connected into a single DC output into the inverter 504, which converts the series connected DC output to an alternating current power supply. If the output is not required to be AC, the inverter may be omitted, or other load, such as a central DC/DC converter or battery charger may be used instead.

The circuit of FIG. 5 provides maximum power available during continuous operation from each solar panel 501 by continuously performing MPPT on the output of each solar panel to react to changes in temperature, solar radiance, shading or other performance deterioration factors of each individual solar panel 501. As shown in FIG. 1, conventional solutions for combining power, perform MPPT on strings 103 or arrays of solar panels 101. As a result of having a separate MPPT circuit in each converter 505, and for each solar panel 501, in the embodiments of the present invention, each string 503 in the embodiment shown in FIG. 5 may have a different number of panels 501 connected in series. Furthermore panels 501 can be installed in different directions, as solar panels 501 do not have to be matched and partial shading degrades the performance of only the shaded panel. According to embodiments of the present invention, the MPPT circuit within the converter 505 harvests the maximum possible power from panel 501 and transfers this power as output regardless of the parameters of other solar panel 501.

Figure 6:
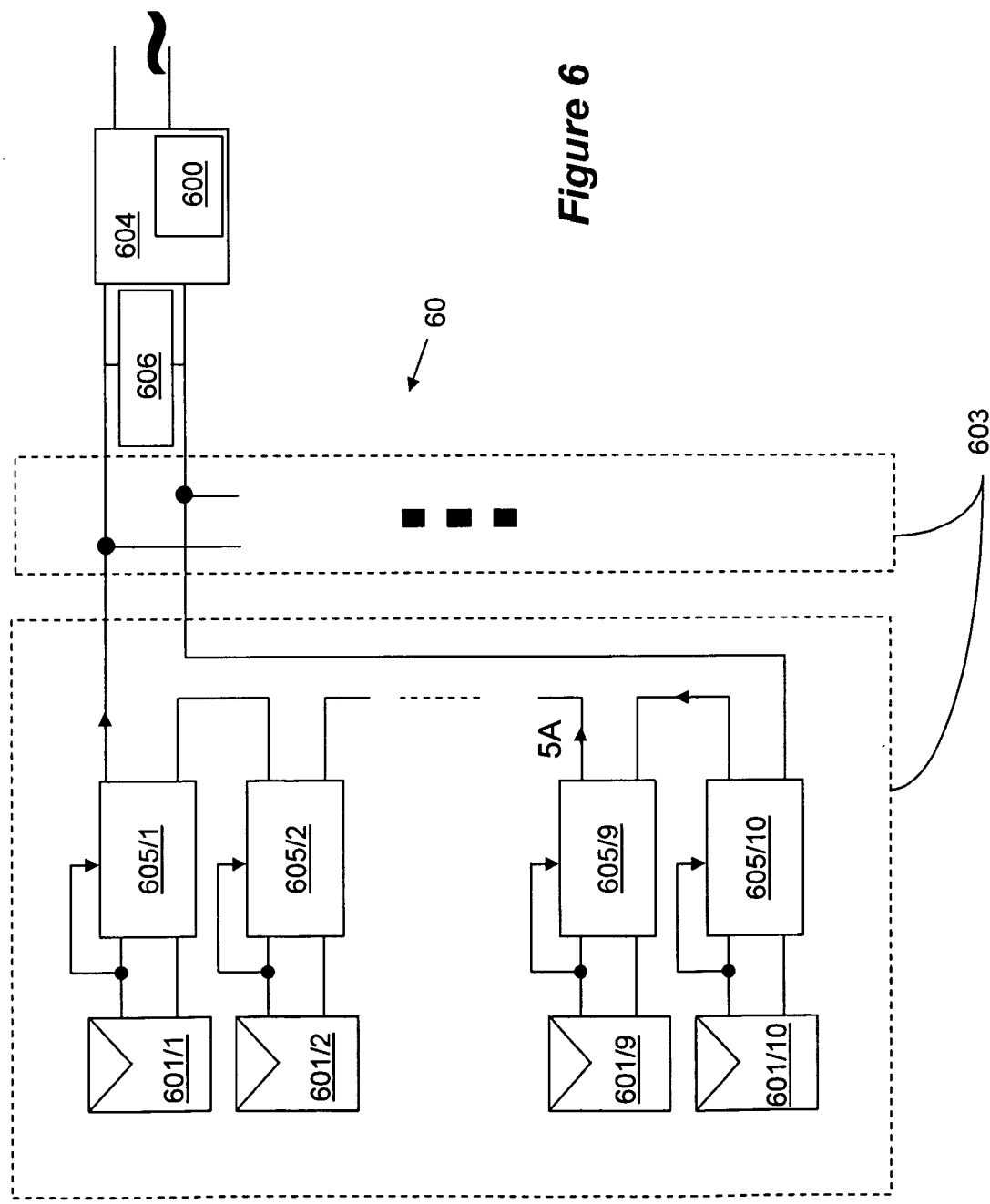
FIG. 6 illustrates a solar system according to another embodiment of the invention.

FIG. 6 illustrates a solar system according to another embodiment of the invention. The embodiment of FIG. 6 is similar to that of FIG. 5, in that panels 601 are connected in series to form strings 603. The strings 603 are then connected in parallel to inverter 604. The inverter 604 includes a central analysis station 600 that receives data from reporting modules within converters 605. Central station 600 also receives data from reporting module 606, which provides data relating to the entire power delivered from all of the panels.

Figure 7:
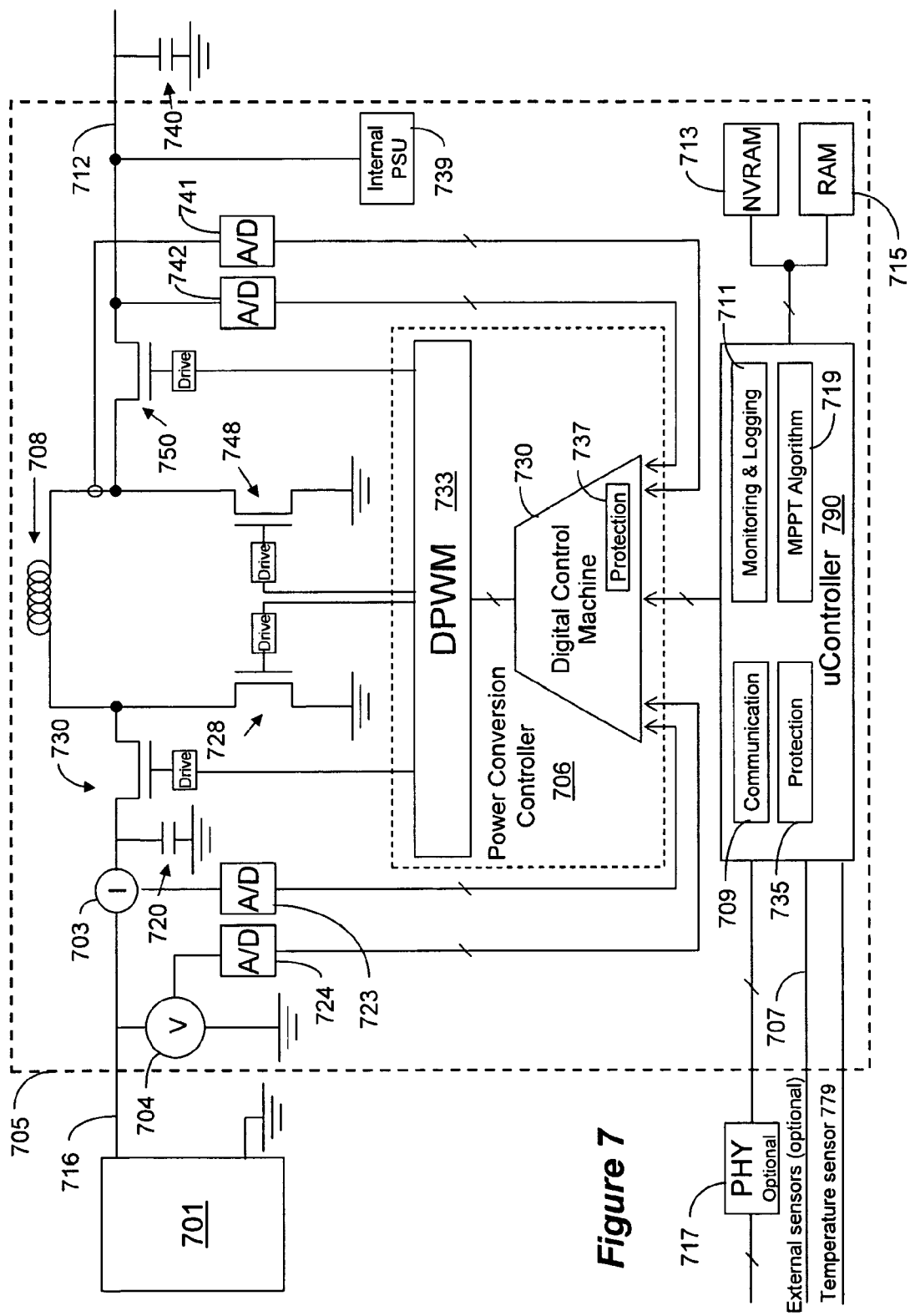
FIG. 7 illustrates a power converter, according to aspects of the invention.

FIG. 7 illustrates a power converter, according to aspects of the invention. FIG. 7 highlights, among others, a monitoring and control functionality of a DC-to-DC converter 705, according to embodiments of the present invention. A DC voltage source 701 is also shown in the figure. Portions of a simplified buck and boost converter circuit are shown for the converter 705. The portions shown include the switching transistors 728, 730, 748 and 750 and the common inductor 708. Each of the switching transistors is controlled by a power conversion controller 706.

The power conversion controller 706 includes the pulse-width modulation (PWM) circuit 733, and a digital control machine 730 including a protection portion 737. The power conversion controller 706 is coupled to microcontroller 790, which includes an MPPT module 719, and may also optionally include a communication module 709, a monitoring and logging module 711, and a protection module 735.

A current sensor 703 may be coupled between the DC power source 701 and the converter 705, and output of the current sensor 703 may be provided to the digital control machine 730 through an associated analog to digital converter 723. A voltage sensor 704 may be coupled between the DC power source 701 and the converter 705 and output of the voltage sensor 704 may be provided to the digital control machine 730 through an associated analog to digital converter 724. The current sensor 703 and the voltage sensor 704 are used to monitor current and voltage output from the DC power source, e.g., the solar panel 701. The measured current and voltage are provided to the digital control machine 730 and are used to maintain the converter input power at the maximum power point.

The PWM circuit 733 controls the switching transistors of the buck and boost portions of the converter circuit. The PWM circuit may be a digital pulse-width modulation (DPWM) circuit. Outputs of the converter 705 taken at the inductor 708 and at the switching transistor 750 are provided to the digital control machine 730 through analog to digital converters 741, 742, so as to control the PWM circuit 733.

A random access memory (RAM) module 715 and a non-volatile random access memory (NVRAM) module 713 may be located outside the microcontroller 706 but coupled to the microcontroller 706. The unique ID and other related data, such as serial number, manufacturer, manufacturing date, etc., may be stored in the NVRAM. A temperature sensor 779 and one or more external sensor interfaces 707 may be coupled to the microcontroller 706. The temperature sensor 779 may be used to measure the temperature of the DC power source 701. A physical interface 717 may be coupled to the microcontroller 706 and used to convert data from the microcontroller into a standard communication protocol and physical layer. An internal power supply unit 739 may be included in the converter 705.

In various aspects of the invention, the current sensor 703 may be implemented by various techniques used to measure current. In one aspect of the invention, the current measurement module 703 is implemented using a very low value resistor. The voltage across the resistor will be proportional to the current flowing through the resistor. In another aspect of the invention, the current measurement module 703 is implemented using current probes which use the Hall Effect to measure the current through a conductor without adding a series resistor. After translating the current to voltage, the data may be passed through a low pass filter and then digitized. The analog to digital converter associated with the current sensor 703 is shown as the A/D converter 723 in FIG. 7. Aliasing effect in the resulting digital data may be avoided by selecting an appropriate resolution and sample rate for the analog to digital converter. If the current sensing technique does not require a series connection, then the current sensor 703 may be connected to the DC power source 701 in parallel.

In one aspect of the invention, the voltage sensor 704 uses simple parallel voltage measurement techniques in order to measure the voltage output of the solar panel. The analog voltage is passed through a low pass filter in order to minimize aliasing. The data is then digitized using an analog to digital converter. The analog to digital converter associated with the voltage sensor 704 are shown as the A/D converter 724 in FIG. 7. The A/D converter 724 has sufficient resolution to generate an adequately sampled digital signal from the analog voltage measured at the DC power source 701 that may be a solar panel.

The current and voltage data collected for tracking the maximum power point at the converter input may be used for monitoring purposes also. An analog to digital converter with sufficient resolution may correctly evaluate the panel voltage and current. However, to evaluate the state of the panel, even low sample rates may be sufficient. A low-pass filter makes it possible for low sample rates to be sufficient for evaluating the state of the panel. The current and voltage date may be provided to the monitoring and logging module 711 for analysis.

The temperature sensor 779 enables the system to use temperature data in the analysis process. The temperature is indicative of some types of failures and problems. Furthermore, in the case that the power source is a solar panel, the panel temperature is a factor in power output production.

The one or more optional external sensor interfaces 707 enable connecting various external sensors to the converter 705. External sensors are optionally used to enhance analysis of the state of the solar panel 701, or a string or an array formed by connecting the solar panels 701. Examples of external sensors include ambient temperature sensors, solar radiance sensors, and sensors from neighboring panels. External sensors may be integrated into the converter 705 instead of being attached externally.

In one aspect of the invention, the information acquired from the current and voltage sensors 703, 704 and the optional temperature and external sensors 705, 707 may be transmitted to a central analysis station for monitoring, control, and analysis using the communications interface 709. The central analysis station is not shown in the figure. The communication interface 709 connects a microcontroller 706 to a communication bus. The communication bus can be implemented in several ways. In one aspect of the invention, the communication bus is implemented using an off-the-shelf communication bus such as Ethernet or RS422. Other methods such as wireless communications or power line communications may also be used. If bidirectional communication is used, the central analysis station may request the data collected by the microcontroller 706. Alternatively or in addition, the information acquired from sensors 703, 704, 705, 707 is logged locally using the monitoring and logging module 711 in local memory such as the RAM 715 or the NVRAM 713.

Analysis of the information from sensors 703, 704, 705, 707 enables detection and location of many types of failures associated with power loss in solar arrays. Smart analysis can also be used to suggest corrective measures such as cleaning or replacing a specific portion of the solar array. Analysis of sensor information can also detect power losses caused by environmental conditions and prevent costly and difficult solar array testing.

Consequently, in one aspect of the invention, the microcontroller 706 simultaneously maintains the maximum power point of input power to the converter 705 from the attached DC power source or solar panel 701 based on the MPPT algorithm in the MPPT module 719 and manages the process of gathering the information from sensors 703, 704, 705, 707. The collected information may be stored in the local memory 713, 715 and transmitted to an external central analysis station. In one aspect of the invention, the microcontroller 706 uses previously defined parameters stored in the NVRAM 713 in order to operate. The information stored in the NVRAM 713 may include information about the converter 705 such as serial number, the type of communication bus used, the status update rate and the ID of the central analysis station. This information may be added to the parameters collected by the sensors before transmission.

The converters 705 may be installed during the installation of the solar array or retrofitted to existing installations. In both cases, the converters 705 may be connected to a panel junction connection box or to cables connecting the panels 701. Each converter 705 may be provided with the connectors and cabling to enable easy installation and connection to solar panels 701 and panel cables.

In one aspect of the invention, the physical interface 717 is used to convert to a standard communication protocol and physical layer so that during installation and maintenance, the converter 705 may be connected to one of various data terminals, such as a computer or PDA. Analysis may then be implemented as software which will be run on a standard computer, an embedded platform or a proprietary device.

The installation process of the converters 705 includes connecting each converter 705 to a solar panel 701. One or more of the sensors 703, 704, 705, 707 may be used to ensure that the solar panel 701 and the converter 705 are properly coupled together. During installation, parameters such as serial number, physical location and the array connection topology may be stored in the NVRAM 713. These parameters may be used by analysis software to detect future problems in solar panels 701 and arrays.

When the DC power sources 701 are solar panels, one of the problems facing installers of photovoltaic solar panel arrays is safety. The solar panels 701 are connected in series during the day when there is sunlight. Therefore, at the final stages of installation, when several solar panels 701 are connected in series, the voltage across a string of panels may reach dangerous levels. Voltages as high as 600V are common in domestic installations. Thus, the installer faces a danger of electrocution. The converters 705 that are connected to the panels 701 may use built-in functionality to prevent such a danger. For example, the converters 705 may limit the output voltage to a safe level until a predetermined minimum load is detected. Only after detecting this predetermined load, the microcontroller 706 ramps up the output voltage from the converter 705.

Another method of providing a safety mechanism is to use communications between the converters 705 and the associated inverter for the string or array of panels. This communication, that may be for example a power line communication, may provide a handshake before any significant or potentially dangerous power level is made available. Thus, the converters 705 would wait for an analog or digital signal from the inverter in the associated array before transferring power to inverter.

The above methodology for monitoring, control and analysis of the DC power sources 701 may be implemented on solar panels or on strings or arrays of solar panels or for other power sources such as batteries and fuel cells.

The innovative monitoring described so far may be implemented in any solar panel installation, but is particularly beneficial for residential and relatively small installations. On the other hand, for large installations, such as, e.g., 025 megawatt solar field and larger, implementing monitoring on each panel may prove to be prohibitively expensive. Accordingly, the monitoring solution provided herein may be modified for such applications.

Figure 8:
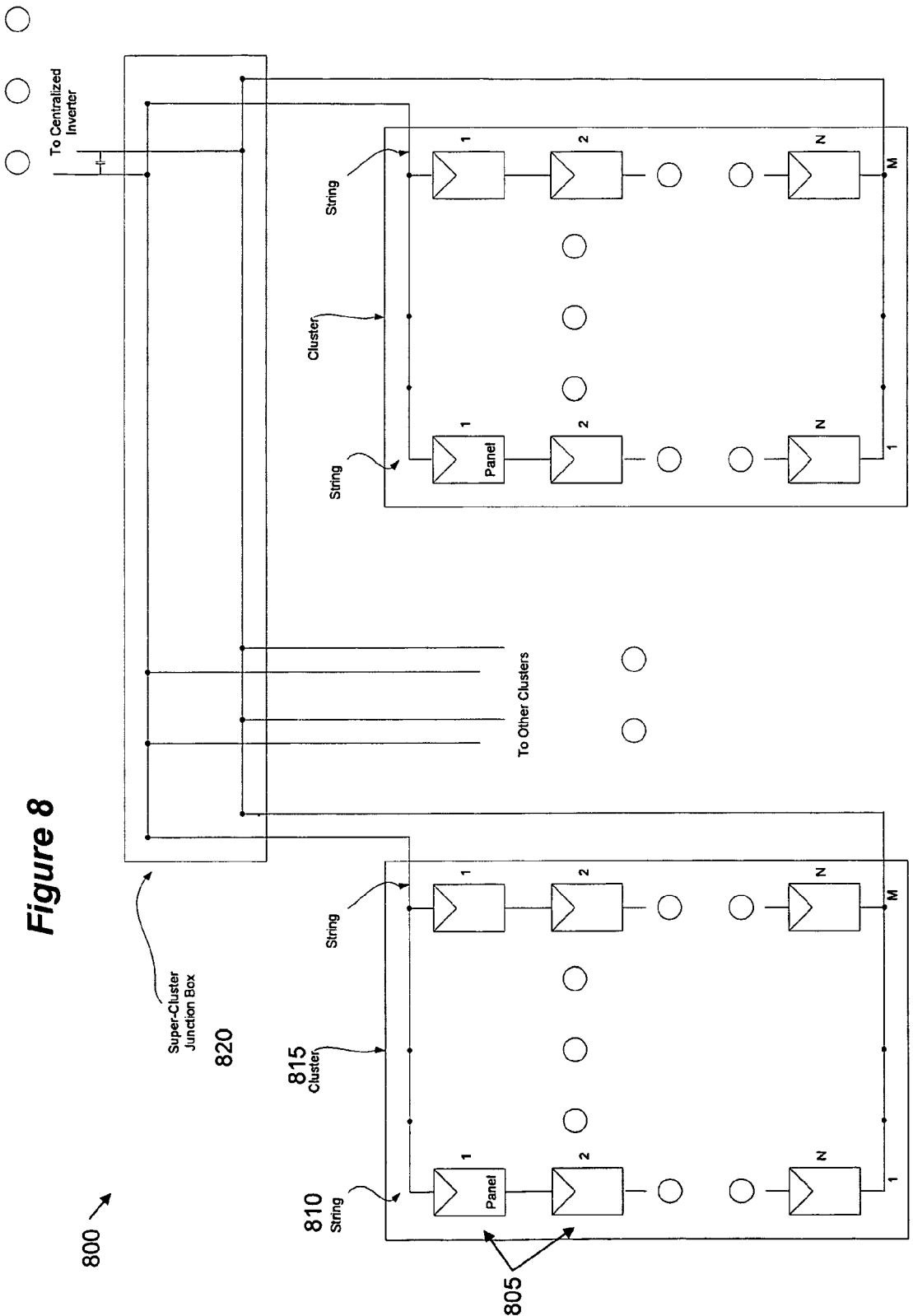
FIG. 8 illustrates a typical centralized solar field installation.

FIG. 8 illustrates a typical centralized solar field installation. In FIG. 8, a large field installation is formed by connecting several solar panels 805 in series so as to form a string 810. Normally 8-20 panels 805 are serially connected to form one string 810. Then, several strings, e.g., eight or twelve strings are connected in parallel to form a cluster 815. Several clusters are then connected together in a super cluster junction box 820, sometimes called a combiner box, to form a super cluster. The super cluster may be connected to a central inverter, or to other super clusters. According to the prior art, monitoring of such a system is done by measuring current and voltage at the output of the super cluster. However, such monitoring detects only major malfunctions and fails to detect smaller problems that, if corrected, can lead to higher efficiency. On the other hand, it has been proposed to provide a monitor at each panel and utilize master-slave arrangement to obtain performance data from each panel. However, such an arrangement is costly both in terms of the additional cost for each monitor on each panel (there are normally hundreds to tens of thousands of panels in large field installations) and in terms of complexity of the transmission requirements. For further background information the reader is directed to U.S. Patent Publication 2006/0162772.

Figure 9:
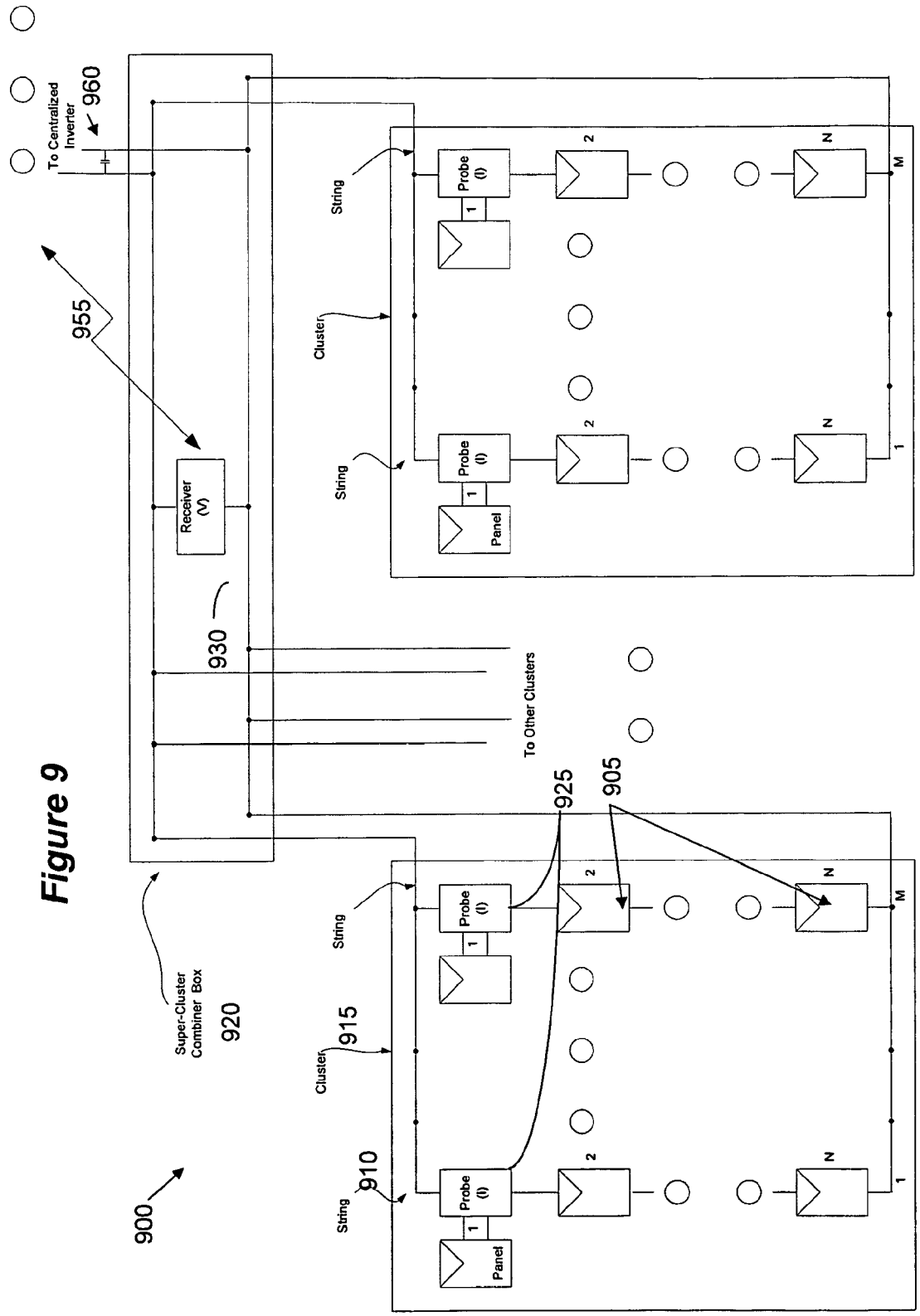
FIG. 9 illustrates a solar field installation implementing monitoring according to an embodiment of the invention.

FIG. 9 illustrates a centralized solar field installation implementing monitoring according to an embodiment of the invention. The system 900 is arranged with panels 905 serially connected to strings 910, which are connected in parallel to form clusters 915, which are in turn connected to a super cluster junction box 920. In the embodiment of FIG. 9 one monitor 925 is installed for each string 910 of serially connected panels 905. The monitor 925 may be the same monitor 300 as in FIG. 3A. On the other hand, in one embodiment the monitor 925 includes only a current probe and transmission means, which may be similar to that of monitor 300. While in FIG. 9 the monitor 925 is shown connected to the first panel 905, it may be connected to any of the serially connected panels in the string 910. Additionally, one voltage monitor 930 is connected at the super cluster junction box 920. A power unit may be used to feed monitors 925 and 930. The power may be derived from one of many power sources, such as batteries or feed-in from another location. In one embodiment monitors 925 and 930 may be fed from power harvested from the cable running through them—the solar panel being monitored in the case of monitor 925, and the current from one or more entire clusters 915 in the case of combiner box 920.

With the arrangement of FIG. 9, since each string 910 is connected in parallel to all other strings at the super cluster junction box 920, the voltage measured by the voltage monitor 930 indicates the voltage of each string 910. The voltage measurement is sent from the box 920 and the current is sent from each string separately to a central monitoring system (not shown). Alternatively, monitors 925 may send their data over power line communication or in other means to monitor 930, which then aggregates the data and sends it to central monitoring system. The monitor 930 may transmit the data it receives together with any data it monitors itself to a central monitoring station (not shown) using other transmission methods, such as Ethernet, wireless communication (WiFi, ZigBee, etc.) via one-way or two way communication, as illustrated by the arrow 955. Consequently, the central monitoring station can calculate the power production from each string. Such monitoring is more sensitive to power drops and other malfunctions at each string. This enables improved identification of failing or malfunctioning panels without the expense of installing monitor at each panel.

Additionally, rather than utilizing complicated master slave arrangement, in this embodiment the monitors 925 send the data using the power line communication via unidirectional communication method as explained above with respect to FIGS. 3A and 3B. This way, no dedicated bus is required and collisions are avoided by using the randomizing mechanism discussed above. Since solar fields may be very large and include many thousands or transmitting monitors, it is beneficial to prevent data transmitted in one part of the field to interfere with data transmitted in other parts. In an aspect of the invention, such a separation might me done by introducing capacitors 960 between the output terminals of each super cluster combiner box 920. This capacitor 920 is used to attenuate the PLC signaling in the super-cluster, and prevent interference with other super-clusters.

Figure 10:
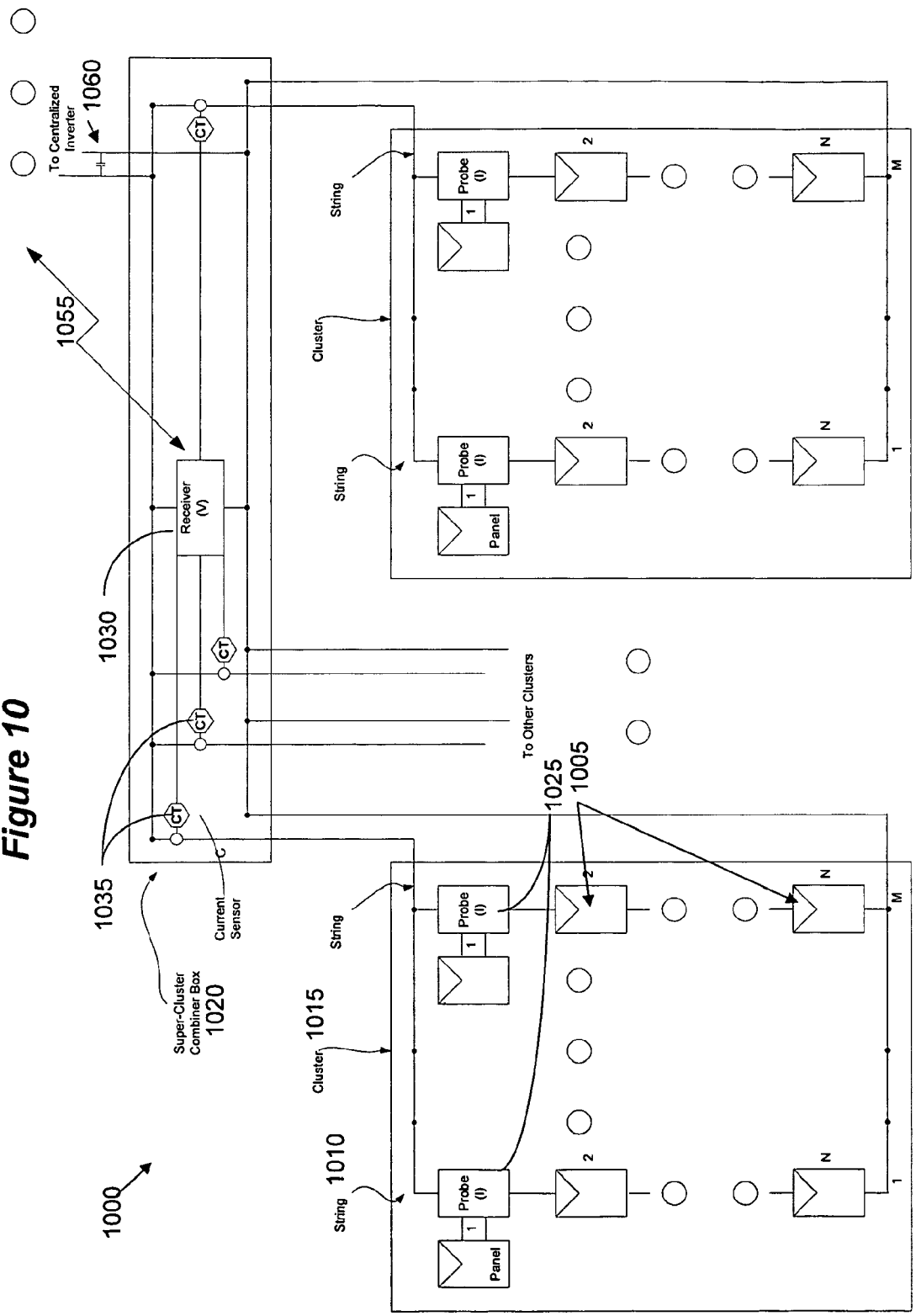
FIG. 10 illustrates a solar field installation implementing monitoring according to another embodiment of the invention.

FIG. 10 illustrates a solar field installation implementing monitoring according to another embodiment of the invention. The embodiment of FIG. 10 is similar to that of FIG. 9, except that a current monitor 1035 is added to measure the total current provided by each cluster 1010. The current measured at current monitor 1035 should be the sum of the current measurements of all of the monitors 1025. That is, the reading of current monitor should be commensurable to the sum of the reading reported by all of the monitors 1025 (less transmission losses). If an abnormal discrepancy is detected, then it means that at least one of the strings 1010 has problem with current delivery. This may be due to a faulty connector, bad cable isolation, or other factors. Thus, the problem is detected and could easily be pinpointed and fixed.

Embodiments of the invention, such as those described above, provide a greater degree of fault tolerance, maintenance and serviceability by monitoring, controlling, logging and/or communicating the performance of each solar panel 501, or strings of solar panels 503. A microcontroller used in the MPPT circuit of the converter 505, may include the monitoring module 300 of FIG. 3A. Then, this microcontroller may also be used to perform the monitoring, logging and communication functions. These functions allow for quick and easy troubleshooting during installation, thereby significantly reducing installation time. These functions are also beneficial for quick detection of problems during maintenance work. Furthermore, by monitoring the operation of each part of the system, preventive maintenance may be performed in a timely manner to avoid downtime of the system.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

What is claimed is:

1. An apparatus, comprising:
   a first power source connected to a power line;
   a first monitoring module comprising a timer, wherein the first monitoring module is configured to collect performance data of the first power source starting from a time when the first power source starts to output power to the power line above a power threshold amount after waking up from a sleep state as detected by the first monitoring module;
   a first transmitter configured to transmit the performance data over the power line;
   a first controller configured to control the first transmitter to transmit the performance data of the first power source over the power line when an elapsed time period from initialization of the timer reaches a transmission time period of the first transmitter;
   a second power source connected to the power line;
   a second monitoring module comprising a second timer, wherein the second monitoring module is configured to collect performance data of these second power source starting from a time when the second power source starts to output power to the power line after waking up from a sleep state as detected by the second monitoring module;
   a second transmitter configured to transmit the performance data of the second power source over the power line; and
   a second controller configured to control the second transmitter to transmit the performance data of the second power source over the power line when an elapsed time period from initialization of the timer reaches a transmission time period of the second transmitter;
   wherein the first controller is configured to control the first transmitter to transmit the performance data of the first power source over the power line when an elapsed time period from initialization of the timer reaches a transmission time period of the first transmitter added to a first random time increment,
   wherein the second controller is configured to control the second transmitter to transmit the performance data of the second power source over the power line when an elapsed time period from initialization of the second timer reaches a transmission time period of the second transmitter added to a second random time increment, and
   wherein the first and second random time increments are different from each other to lessen a possibility of collisions in transmissions of performance data of the first power source and the second power source over the power line.

2. The apparatus of claim 1, wherein the first monitoring module further comprises a randomizer configured to include random time increments in the transmission time period of the first power source.

3. The apparatus of claim 1, further comprising:
   a current measurement module configured to collect current data of the first power source; and
   a voltage measurement module configured to collect voltage data of the first power source.

4. The apparatus of claim 1, further comprising a temperature sensor configured to sense temperature data of the first power source.

5. The apparatus of claim 1, wherein the first monitoring module further comprises an arc detection module configured to detect arcing at the first power source.

6. The apparatus of claim 1, further comprising a memory configured to store the performance data accumulated since the initialization of the timer.

7. The apparatus of claim 1, further comprising:
a communication module configured to transmit the performance data over the power line to a communication translator.

8. A method, comprising:
monitoring, by a monitoring module that includes a microcontroller, power generation of a first power source;
when power generation of the first power source passes a threshold after having awaken from a sleep state as detected by the monitoring module, initializing a timer and collecting performance data of the first power source;
monitoring an elapsed time period of the timer from initialization of the timer;
generating a first random time increment to be applied for a transmission time period of the first power source;
determining, by a first controller, the transmission time period of the first power source by adding the first random time increment to a periodic transmission time of the first power source;
determining whether an elapsed time period of the timer has reached the transmission time period of the first power source;
in response to determining that the elapsed time period has reached the transmission time period of the first power source, transmitting collected performance data of the first power source over a power line;
generating a second random time increment to be applied for a transmission time period of a second power source connected to a same power line as the first power source; and
determining, by a second controller, a transmission time period for transmitting performance data of the second power source over the power line by adding the second random time increment to a periodic transmission time of the second power source,
wherein the first and second random time increments are different from each other to lessen a possibility of collisions in transmissions of performance data of the first power source and the second power source over the power line.

9. The method of claim 8, wherein transmitting collected performance data over a power line comprises:
transmitting, to a communication translator in communication with a plurality of power sources, the collected performance data over the power line that is shared with the plurality of power sources.

10. The method of claim 8, wherein collecting performance data further comprises storing the performance data in memory, and wherein transmitting the collected performance data comprises transmitting the collected performance data accumulated since a previous transmission of performance data.

11. The method of claim 8, wherein collecting performance data comprises measuring at least one of output voltage and output current.

12. The method of claim 8, wherein transmitting the collected performance data over a power line comprises:
transmitting the collected performance data with a unique identifier of the first power source and a unique identifier of a second power source over the power line different from the unique identifier of the first power source.

13. The method of claim 8, further comprising:
detecting for wideband noise; and
in response to detecting wideband noise above a threshold, transmitting an interrupt message.

14. A system, comprising:
a plurality of panel units connected to a communication line, wherein each panel unit comprises:
a power source;
a monitoring module configured to collect performance data of the power source;
a transmitter configured to transmit the performance data over the communication line; and
a controller configured to control the transmitter to transmit the performance data using the communication line; and
a communication translator configured to receive the performance data from each of the plurality of panel units over the communication line, wherein the controller of each panel unit is configured to avoid transmission collisions with controllers of other panel units by applying different time increments to be added to transmission times for transmission of the performance data for each of the plurality of panel units over the communication line.

15. The system of claim 14, wherein the monitoring module comprises a timer, and wherein the controller is configured to transmit the performance data based on an elapsed time period of the timer and a transmission time period associated with the panel unit of the controller.

16. The system of claim 15, wherein the monitoring module further comprises a randomizer configured to include random time increments in the transmission time period for each of the plurality of panel units over the communication line so as to lessen a possibility of collisions due to transmissions of performance data of the respective plurality of panel units over a power line.

17. The system of claim 14, wherein the communication line comprises a power line that carries electrical power generated by each of the plurality of panel units, and wherein a power signal corresponding to the electrical power sent over the power line by each of the plurality of panel units is separate and distinct from a communication signal corresponding to the performance data sent over the power line by each of the plurality of panel units.

18. The system of claim 14, further comprising:
a central analysis station configured to detect for faults, wherein the communication translator is configured to transmit the performance data to the central analysis station.

* * * * *